United States Patent
Gundel

(10) Patent No.: US 9,355,755 B2
(45) Date of Patent: May 31, 2016

(54) HIGH SPEED TRANSMISSION CABLE

(75) Inventor: Douglas B. Gundel, Cedar Park, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/985,070

(22) PCT Filed: Apr. 4, 2012

(86) PCT No.: PCT/US2012/032126
§ 371 (c)(1),
(2), (4) Date: Aug. 13, 2013

(87) PCT Pub. No.: WO2012/138729
PCT Pub. Date: Oct. 11, 2012

(65) Prior Publication Data
US 2014/0027150 A1    Jan. 30, 2014

Related U.S. Application Data

(60) Provisional application No. 61/472,725, filed on Apr. 7, 2011.

(51) Int. Cl.
*H01B 7/08* (2006.01)
*H01B 11/18* (2006.01)
(Continued)

(52) U.S. Cl.
CPC .............. *H01B 7/08* (2013.01); *G02B 6/4429* (2013.01); *H01B 7/0838* (2013.01); *H01B 11/1856* (2013.01); *H05K 9/00* (2013.01); *H01B 11/203* (2013.01)

(58) Field of Classification Search
CPC .......... G02B 6/4429; G02B 6/44; H05K 9/00; H01B 7/02; H01B 7/0838; H01B 7/08; H01B 7/0233; H01B 11/1856; H01B 11/203; Y10T 428/2935

USPC ....... 174/29, 102 R, 117 F; 385/114; 428/376
See application file for complete search history.

(56) References Cited

U.S. PATENT DOCUMENTS 463,107 A    11/1891    Degenharat
1,978,418 A  10/1934    Dudley
(Continued)

FOREIGN PATENT DOCUMENTS

AU    273087     3/1965
DE    1804663    2/1970
(Continued)

OTHER PUBLICATIONS

International Search Report for PCT International Application No. PCT/US2012/032126, mailed on Jul. 3, 2012, 5 pages.

*Primary Examiner* — Timothy Thompson
*Assistant Examiner* — Guillermo Egoavil
(74) *Attorney, Agent, or Firm* — Robert S. Moshrefzadeh

(57) ABSTRACT

The present invention relates to a high speed transmission cable (100A) that includes a first conductor set (110), a dielectric film (120A) at least partially concentrically disposed around the first conductor set (110) and a pinched portion (150A) forming an insulating envelope (140A) around the first conductor set (110). The dielectric film (120A) includes a base layer (122) having a plurality of first protrusions (124) formed on a first major surface of the base layer (122), wherein the dielectric film (120A) is disposed such that the base layer (122) is partially concentric with the conductor set (110) and wherein a portion of the first protrusions (124) is disposed between the first conductor set (110) and the base layer (122) in a region where the base layer (122) is concentric with the first conductor set (110).

29 Claims, 26 Drawing Sheets

(51) Int. Cl.
*G02B 6/44* (2006.01)
*H05K 9/00* (2006.01)
*H01B 11/20* (2006.01)

(56) References Cited

U.S. PATENT DOCUMENTS

| | | | |
|---|---|---|---|
| 2,035,274 A | 3/1936 | Mougey | |
| 2,038,973 A | 4/1936 | Wentz | |
| 2,210,400 A | 8/1940 | Fischer | |
| 2,381,003 A | 8/1945 | Ryan | |
| 2,556,244 A | 6/1951 | Weston | |
| 2,583,026 A | 1/1952 | Swift | |
| 2,599,857 A | 6/1952 | Mildner | |
| 2,614,172 A | 10/1952 | Greenfield | |
| 2,722,562 A | 11/1955 | McIlveen | |
| 2,792,442 A | 5/1957 | Parce | |
| 2,890,263 A | 6/1959 | Brandes | |
| 3,025,340 A | 3/1962 | Olson | |
| 3,077,510 A | 2/1963 | Olds | |
| 3,086,557 A | 4/1963 | Peterson | |
| 3,126,438 A | 3/1964 | Lorrin | |
| 3,227,800 A | 1/1966 | Bondon | |
| 3,244,799 A | 4/1966 | Roberts | |
| 3,248,473 A | 4/1966 | Buhmann | |
| 3,496,281 A | 2/1970 | McMahon | |
| 3,514,523 A | 5/1970 | Hildebrand | |
| 3,609,207 A | 9/1971 | Maschio | |
| 3,650,862 A | 3/1972 | Burr | |
| 3,663,739 A * | 5/1972 | Chevrier | H01B 7/08 174/117 F |
| 3,748,373 A | 7/1973 | Remy | |
| 3,750,058 A | 7/1973 | Bankert | |
| 3,789,129 A | 1/1974 | Ditscheid | |
| 3,864,509 A | 2/1975 | Gommans | |
| 4,011,118 A | 3/1977 | Geominy | |
| 4,018,977 A | 4/1977 | Herrmann | |
| 4,092,485 A | 5/1978 | Wanser | |
| 4,096,346 A * | 6/1978 | Stine et al. | 174/36 |
| 4,097,324 A * | 6/1978 | Emmel | B29C 59/046 156/179 |
| 4,132,855 A | 1/1979 | Clark | |
| 4,145,565 A | 3/1979 | Donon | |
| 4,190,733 A | 2/1980 | Wootton | |
| 4,246,937 A | 1/1981 | Muller | |
| 4,394,705 A | 7/1983 | Blachman | |
| 4,487,660 A | 12/1984 | Netzel | |
| 4,716,260 A * | 12/1987 | Hoffman | H01B 7/046 174/102 R |
| 4,758,685 A | 7/1988 | Pote | |
| 4,767,890 A | 8/1988 | Magnan | |
| 4,987,274 A | 1/1991 | Miller | |
| 5,107,076 A | 4/1992 | Bullock | |
| 5,130,497 A | 7/1992 | Yoshikawa | |
| 5,132,488 A | 7/1992 | Tessier | |
| 5,196,078 A | 3/1993 | Pote | |
| 5,262,593 A | 11/1993 | Madry | |
| 5,286,923 A | 2/1994 | Prudhon | |
| 5,286,924 A | 2/1994 | Loder | |
| 5,486,649 A | 1/1996 | Gareis | |
| 5,532,657 A | 7/1996 | Stoehr | |
| 5,569,876 A * | 10/1996 | Podgorski | H01B 9/04 174/137 R |
| 5,817,981 A | 10/1998 | Arroyo | |
| 5,872,334 A * | 2/1999 | Trazyik | 174/36 |
| 5,990,419 A | 11/1999 | Bogese, II | |
| 6,037,545 A | 3/2000 | Fox | |
| 6,452,105 B2 | 9/2002 | Badii | |
| 6,465,737 B1 | 10/2002 | Bonato | |
| 6,476,326 B1 | 11/2002 | Fuzier | |
| 6,812,401 B2 | 11/2004 | Karrmann | |
| 6,812,408 B2 | 11/2004 | Clark | |
| 6,849,799 B2 | 2/2005 | Springer | |
| 7,115,815 B2 | 10/2006 | Kenny | |
| 7,154,043 B2 | 12/2006 | Clark | |
| 7,202,418 B2 | 4/2007 | Glew | |
| 7,205,479 B2 | 4/2007 | Caveney | |
| 7,238,886 B2 * | 7/2007 | Wiekhorst | H01B 7/0233 174/110 R |
| 7,256,351 B2 * | 8/2007 | Dillon et al. | 174/113 R |
| 2003/0196828 A1 * | 10/2003 | Schilson et al. | 174/117 F |
| 2004/0074654 A1 | 4/2004 | Springer | |
| 2004/0256139 A1 | 12/2004 | Clark | |
| 2005/0051355 A1 | 3/2005 | Bricker | |
| 2007/0163800 A1 | 7/2007 | Clark | |
| 2007/0193769 A1 * | 8/2007 | Clark et al. | 174/113 R |
| 2007/0209823 A1 | 9/2007 | Vexler | |
| 2008/0080822 A1 * | 4/2008 | Chiasson | G02B 6/4404 385/114 |
| 2010/0132973 A1 * | 6/2010 | Fitz | H01B 9/02 174/102 R |
| 2010/0232753 A1 * | 9/2010 | Parris | G02B 6/4494 385/109 |
| 2012/0090873 A1 * | 4/2012 | Gundel | 174/113 R |

FOREIGN PATENT DOCUMENTS

| | | |
|---|---|---|
| GB | 921232 | 3/1963 |
| GB | 1202455 | 8/1970 |
| GB | 1203484 | 8/1970 |
| GB | 2169437 | 7/1986 |
| JP | 2010-097882 | 4/2010 |
| WO | WO 2009-009747 | 1/2009 |
| WO | WO 2010-148157 | 12/2010 |
| WO | WO 2010-148161 | 12/2010 |
| WO | WO 2010-148164 | 12/2010 |
| WO | WO 2010-148165 | 12/2010 |
| WO | WO 2012-138729 | 10/2012 |

* cited by examiner

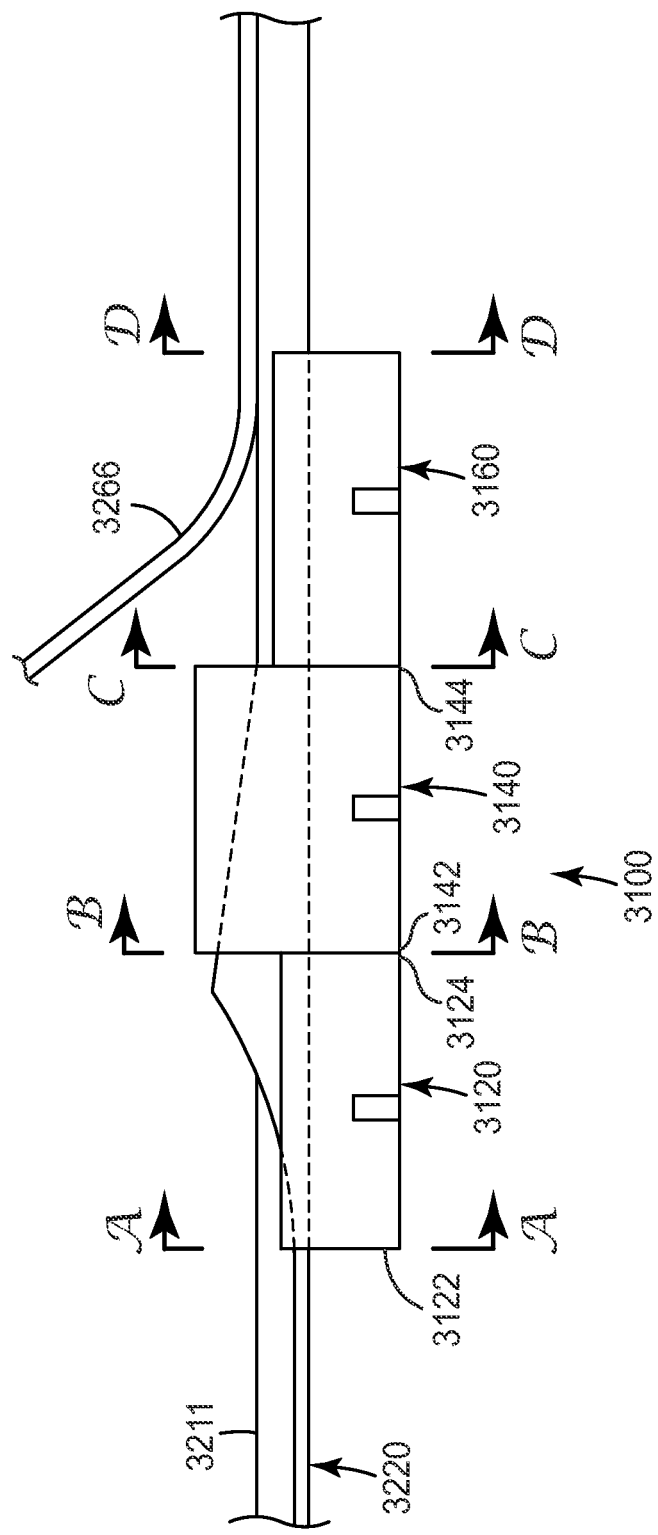

HIGH SPEED TRANSMISSION CABLE

TECHNICAL FIELD

The present disclosure relates generally to shielded electrical cables for the transmission of electrical signals. In particular, the present invention relates to high speed electric cables that can include a structured dielectric layer adjacent to the current carrying internal conductors of the cable.

BACKGROUND

Electrical cables for the high speed transmission of electrical signals are well known. One common type of electrical cable is a coaxial cable. High speed transmission cables generally include an electrically conductive central conductor(s) or wire(s) surrounded by an insulating dielectric layer. An exemplary high speed transmission cable is a coaxial cable. In a coaxial cable, the electrically conductive conductor and insulating dielectric layer can further include an outer conductor and a protective outer jacket.

The insulating dielectric layer can be composed of any material or combination of materials that electrically separate the central conductor from other conductors within the cable. The material properties of the dielectric layer can significantly affect the transmission of the electrical signal along the length of a high speed transmission cable. Minimal interaction between the electric field and the dielectric layer is generally desired to maintain the signal integrity and to reduce the capacitance of the electrical signal. Capacitance slows the propagation rate of the electrical signal and reduces the signal strength. Additionally, capacitance is a strong contributor to the cable's impedance, and therefore the dielectric layer has the role of influencing the magnitude and uniformity of the cable impedance, which is generally desired to be a constant along the length of a given insulated wire. Key electrical properties influenced by the material properties of the dielectric layer include signal attenuation, signal propagation rate, capacitance per given cable length, impedance, and the uniformity of these electrical properties along the length of the cable. Conversely, it may be desirable for the cable to have prescribed electrical properties, such as a known impedance value. Prescribing these electrical properties will impact the structure and dimensions of the dielectric layer. The dielectric structure and the material's dielectric constant will directly influence the required thickness of the dielectric layer and hence the cable diameter, the cable flexibility, and related properties.

For example, the velocity of propagation (VOP) of electrical signal along a coax cable relative to the speed of the electrical signal along a conductor surrounded by air is:

$$VOP = \frac{1}{\sqrt{\varepsilon_{\mathit{eff}}}}$$

where $\varepsilon_{\mathit{eff}}$ is the effective dielectric constant of the dielectric layer surrounding the central conductor. The dielectric constant of air is virtually equal to one while solid dielectric materials have a dielectric constant of greater than one. In order to maximize the velocity of propagation of the electrical signal, the effective dielectric constant of the dielectric layer should be minimized. The inclusion of air into the dielectric layer is one way to reduce the effective dielectric constant of the dielectric layer.

Although electrical properties of the transmission cable generally improve with the incorporation of air into the dielectric structure, air alone (at ambient pressure) can not provide adequate support to counteract external forces that can be applied to the cable during manufacture, installation and use of the cable. Failure to support the external load at any point can result in local distortions of the spacing between the central conductor and surrounding structures of the cable, thereby changing the distribution of the electric and magnetic fields around the central conductor, creating local impedance changes which can result in signal reflections and degraded signal integrity. If these distortions are significantly large (like a kink in the cable) or numerous, the cable may no longer be suitable as a high speed transmission line. Because air alone is not a sufficient support, the dielectric layer will also include a higher stiffness material form and maintain the space between the inner conductor and the surrounding structures of the cable.

Three types of dielectric layer structures which include a significant amount of air surrounding the central conductor are routinely practiced in the art: A) foamed and expanded polymers, B) thin helically wound monofilaments and, C) axially-extruded channels.

Foamed or expanded structures can have air content up to about 70% resulting in an effective dielectric constant to 1.3-1.5. However, the stiffness of the resulting dielectric layer can be quite low, and may fail to provide sufficient support to the central conductor under applied loads and may allow the central conductor to kink when tightly bent. When loaded, these structures readily buckle and crush.

The helically-wound structures typically utilize a monofilament or deviations thereof that are wrapped around a central conductor. An insulator tube is extruded over the wrapped conductor structure. These helically-wound structures can also have low effective dielectric constants (~1.3), but typically provide support against external forces at one point around the circumference of the central conductor at any given cross-section. This individual contact point can also be insufficient to support external load exerted at any point around the circumference of the central conductor that is not directly adjacent to the wrapped filament which can lead to local deformations or kinking of the central conductor on bending and result in attendant signal integrity issues.

The third type of dielectric layer structures which include a significant amount of air are longitudinally extruded structures formed along the conductor axis with a modified extrusion tip. These extruded structures can generally result in an effective dielectric constant of 1.45 or higher, but the axial extrusion process of a molten polymer is not well-suited to providing small, closely-spaced features since surface tension and the dynamics of extruding a liquid material in this manner drives rounding of the features. Additionally, this process cannot readily form features that vary along the axial direction, (i.e. each cross section profile is the same). Also, the process is limited to materials that can be extruded around a conductor at the required thickness.

In summary, the prior art dielectric structures do not have sufficient ability to provide low effective dielectric constants combined with sufficient mechanical integrity and design flexibility. A need exists for high speed transmission cables that include a dielectric layer that incorporates a significant amount of air adjacent to and around the central conductor while providing more uniform support around the central conductor resulting in a dielectric layer having greater mechanical stability while simultaneously having a low effective dielectric constant.

SUMMARY

In one aspect, the present invention provides a high speed transmission cable includes a first conductor set, a dielectric film at least partially concentrically disposed around the first conductor set and a pinched portion forming an insulating envelope around the first conductor set. The first conductor set includes one or more substantially parallel inner conductors defining a longitudinal axis of the transmission cable. The dielectric film includes a first edge and a second edge longitudinally aligned with the first conductor set. The dielectric film includes a base layer having a plurality of first protrusions formed on a first major surface of the base layer, wherein the dielectric film is disposed such that the base layer is partially concentric with the conductor set and wherein a portion of the first protrusions is disposed between the first conductor set and the base layer in a region where the base layer is concentric with the first conductor set.

In another aspect, the present invention provides a high speed transmission cable that includes a first conductor set having two parallel inner conductors defining a longitudinal axis of the transmission cable, a dielectric film at least partially concentrically disposed around the first conductor set wherein a portion of the dielectric film is disposed between the two parallel inner conductors. The dielectric film includes a base layer having a plurality of first protrusions formed on a first major surface of the base layer, wherein the dielectric film is disposed such that the base layer is partially concentric with the first conductor set and wherein a portion of the first protrusions is disposed between the first conductor set and the base layer in a region where the base layer is concentric with the first conductor set.

The above summary of the present invention is not intended to describe each disclosed embodiment or every implementation of the present invention. The Figures and detailed description that follow below more particularly exemplify illustrative embodiments.

BRIEF DESCRIPTION OF THE DRAWINGS

FIG. 14 is a schematic representation of an exemplary fabrication process for creating a high speed transmission cable in accordance with the current invention.

DETAILED DESCRIPTION

In the following detailed description of the preferred embodiments, reference is made to the accompanying drawings that form a part hereof. The accompanying drawings show, by way of illustration, specific embodiments in which the invention may be practiced. It is to be understood that other embodiments may be utilized and structural or logical changes may be made without departing from the scope of the present invention. The following detailed description, therefore, is not to be taken in a limiting sense, and the scope of the invention is defined by the appended claims.

The present invention is directed to a high speed transmission cable having a structured dielectric film(s) formed around the internal conductors to create electrical transmission lines with higher propagation speed, lower weight, and smaller size (and higher density) as well as greater dielectric constant consistency and greater crush resistance than conventional cable designs. The structured dielectric film(s) create air spaces around the inner conductors. In one exemplary aspect, these structured dielectric films include a multilayer base layer having protrusions formed on at least a portion of one major surface, where in at least one of the sub-layer within the base layer is an electrically conductive shielding layer.

Incorporating air into a primary dielectric material in a transmission line can provide a number of benefits including reduction in weight, reduction in the loss contributed by the dielectric material, and a reduction in the dielectric constant of the resulting dielectric film. The dielectric constant reduction in turn increases the signal propagation rate and reduces the dielectric thickness needed for a given impedance and therefore the transmission cable can be smaller. A common method for incorporating air is to foam the insulating material, but the resulting material can crush easily and the air content is frequently dispersed heterogeneously through the insulating material resulting in a dielectric material having a non constant dielectric constant. The insulating material used in the present invention is a structured dielectric film where the air is incorporated in a repeating or structured way into the transmission cable.

Figure 1A:
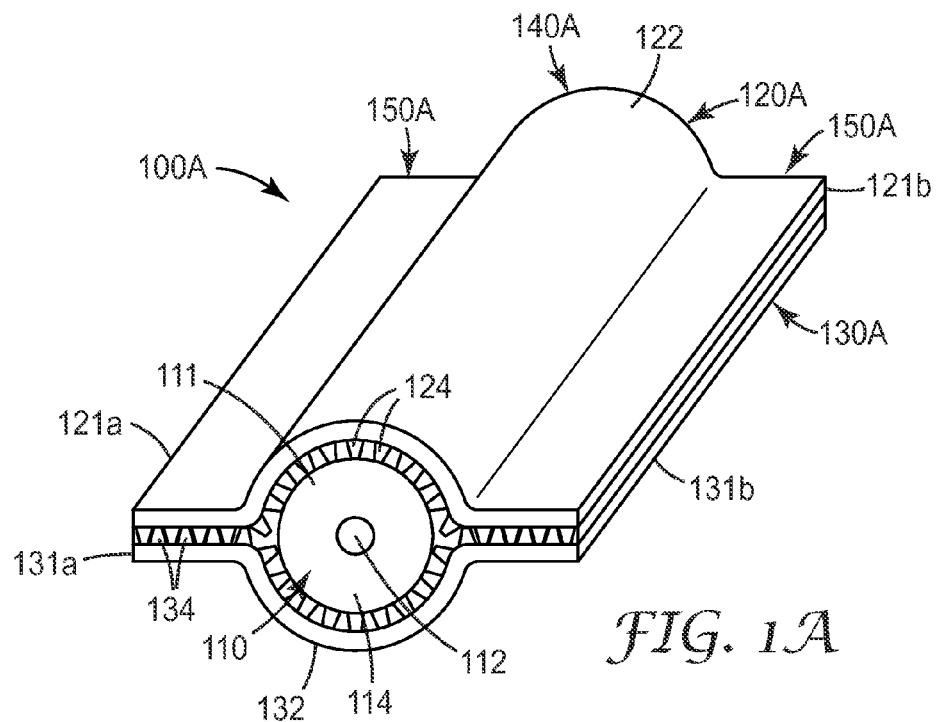
FIGS. 1A-1C show three isometric views of exemplary high speed transmission cables according to an aspect the present invention.

FIG. 1A illustrates an exemplary embodiment of a high speed transmission cable 100A according to an aspect of the present invention. The high speed transmission cable includes a first conductor set 110, a first dielectric film 120A at least partially concentrically disposed around the first conductor set, a second dielectric film 130A at least partially concentrically disposed around the first conductor set opposite the first dielectric film and a pinched portion joining the first and second dielectric films. The first conductor set includes one inner conductor 111 defining a longitudinal axis of the transmission cable. The first inner conductor can be a bare conductor in the form of a metallic ribbon or wire, a coated conductor comprising an inner conductive core 112 and an insulating layer 114 surrounding the inner conductive core or a coaxial cable.

The first dielectric film 120A includes a first edge 121*a* and a second edge 121*b* longitudinally aligned with the first conductor set 110. The first dielectric film includes a base layer 122 having a plurality of first protrusions 124 formed on a first major surface of the base layer, wherein the first dielectric film can be disposed such that the base layer is partially concentric with the conductor set and wherein a portion of the first protrusions is disposed between the first conductor set and the base layer in a region where the base layer is concentric with the first conductor set.

The second dielectric film 130A can be similar the first dielectric film 120A in that the second dielectric film includes a first edge 131*a* and a second edge 131*b* longitudinally aligned with the first conductor set 110. The second dielectric film includes a base layer 132 having a plurality of first protrusions 134 formed on a first major surface of the base layer. The second dielectric film can be disposed partially concentric with the conductor set opposite the first dielectric film such that the base layer of the second dielectric film is partially concentric with the conductor set and wherein a portion of the first protrusions of the second dielectric film are disposed between the first conductor set and the base layer of the second dielectric in a region where the base layer is concentric with the first conductor set.

Figure 1B:
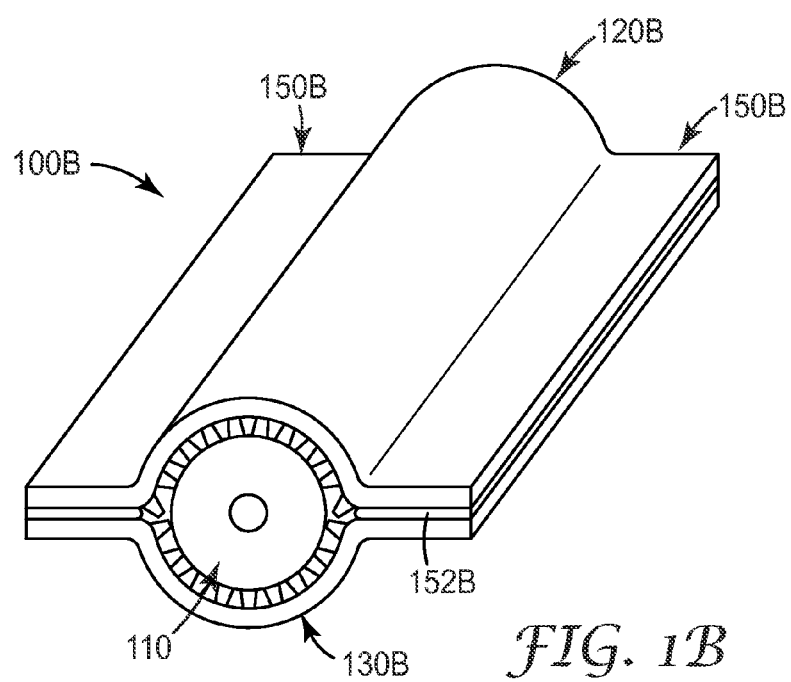

The pinched portions extends parallel with the longitudinal axis of the conductor set and forms an insulating envelope 140A around the first conductor set 110 by joining the first and second layers 120A, 130A. FIG. 1A shows the first and second dielectric films 120A, 130A of transmission cable 100A can be joined together by the interlocking protrusions of the first dielectric film with the protrusions 134 of second dielectric film 130A in pinched portion 150A. Alternatively, an adhesive layer may be disposed between the first and second dielectric films within the pinched portion of the cable to form the transmission cable. This latter aspect can reduce the need for precise registration between the first and second dielectric films and the conductor set which they enclose. FIG. 1B shows the first and second dielectric films 120B, 130B of transmission cable 100B can be joined together by bonding the first dielectric film to the second dielectric film in a bonding region 152B by and adhesive or fusion bonding the first and second dielectric films at a sufficient temperature and pressure to cause the protrusions to melt and flow together to form the bonding region in pinched portion 150B.

Figure 1C:
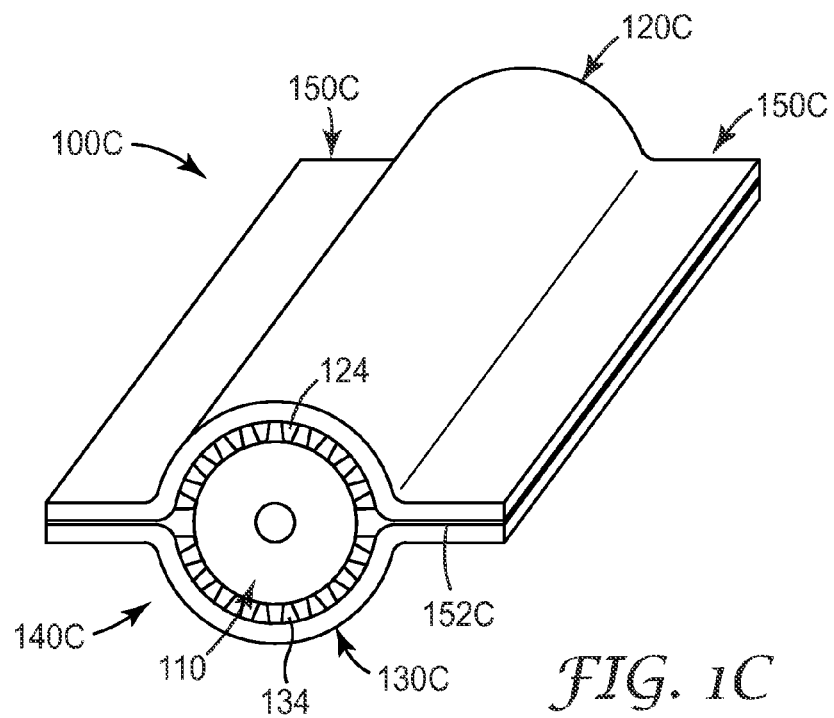

FIG. 1C shows a transmission cable 100C having protrusions 124, 134 formed on the first and second dielectric films 120C, 130C, respectively, only in the region of the insulating envelope 140C between pinched portions 150C. The first and second dielectric films 120C, 130C of transmission cable 100C can be joined together by bonding the first dielectric film to the second dielectric film in a bonding region 152C by thermal welding of the base layer of the first and second dielectric films.

Figure 2:
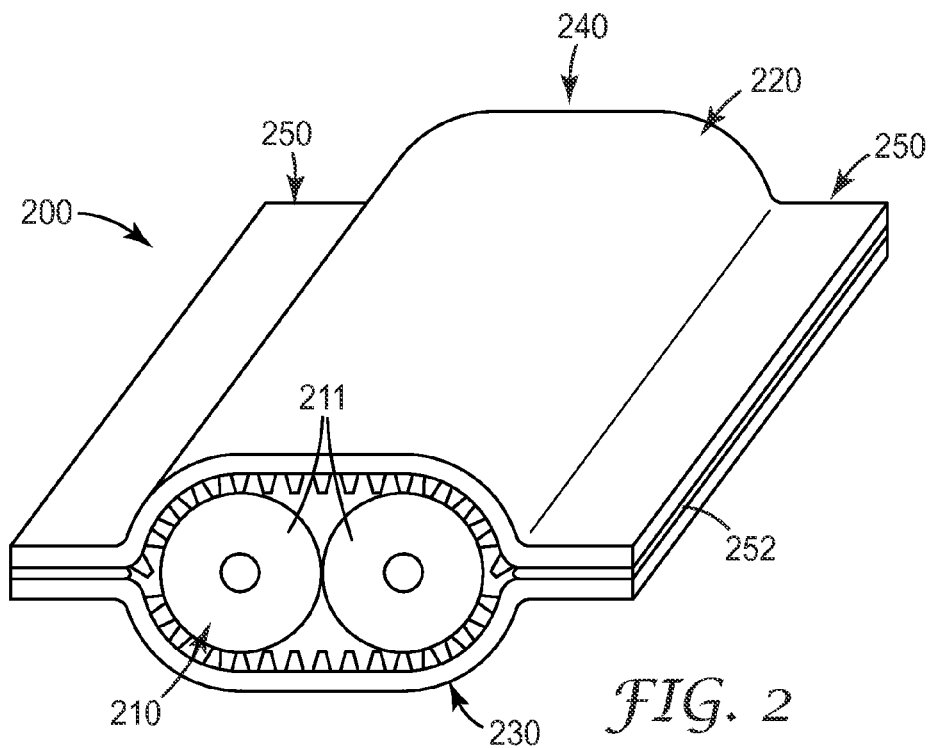
FIG. 2 shows an isometric view of an alternative exemplary high speed transmission cable according to an aspect the present invention.

FIG. 2 illustrates an exemplary embodiment of a high speed transmission cable 200 according to an aspect of the present invention that includes a first conductor set 210, a first dielectric film 220 at least partially concentrically disposed around the first conductor set, a second dielectric film 230 at least partially concentrically disposed around the first conductor set opposite the first dielectric film and a pinched portion joining the first and second dielectric films. The first conductor set 210 includes two inner conductors 211 defining a longitudinal axis of the transmission cable. The inner conductors can be coated conductors comprising an inner conductive core and on insulating layer surrounding the inner conductive core or coaxial cables. The first and second dielectric films 220, 230 of transmission cable 200 can be joined together by bonding the first dielectric film to the second dielectric film in a bonding region 252 by an adhesive or fusion bonding the first and second dielectric films at a sufficient temperature and pressure to cause the protrusions to melt and flow together to form the bonding region in pinched portion 250.

FIGS. 3A-3D, 4A-4D and 5A-5C illustrate dielectric films that can be used in a high speed transmission cable according to an aspect the present invention.

Figure 3A:
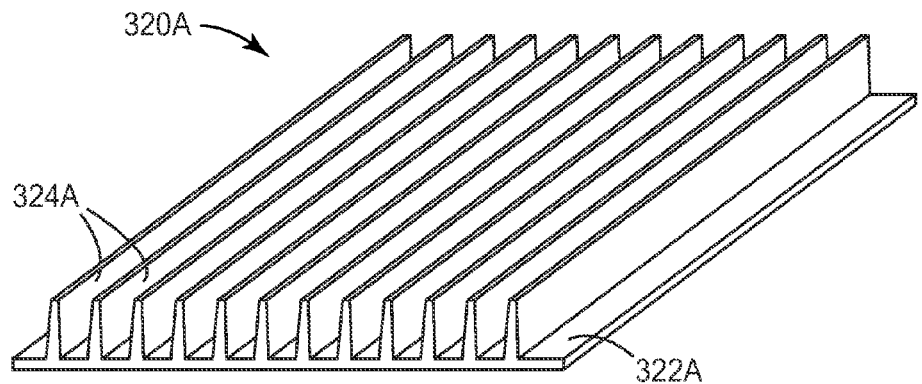
FIGS. 3A-3D show four isometric views of exemplary dielectric films that can be used in a high speed transmission cable according to an aspect the present invention.
Figure 4A:
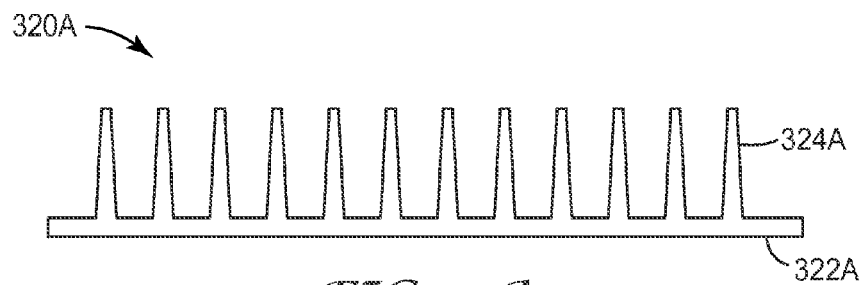
FIGS. 4A-4D show four cross sectional views of exemplary dielectric films of FIGS. 3A-3D, respectively.

FIG. 3A is schematic drawing of a first exemplary dielectric film 320A having a characteristic cross-section as shown in FIG. 4A. Dielectric film 320A includes a base layer 322A having a plurality of first protrusions 324A formed on a first major surface of the base layer. In one exemplary aspect, the base layer of the dielectric film is a continuous sheet of material while in another aspect the base layer can be a perforated sheet of material. The first protrusions have a first geometry characterized by a first critical dimension. First protrusions 324A are in the form of longitudinally extending ridges wherein the critical dimension is the height of the ridge. When dielectric film 320A is used in a transmission cable the height of the first protrusions controls the separation between the conductor set and the base layer of the dielectric film. Increasing the height of the ridges can increase the amount of air between the base layer and the first conductor set which can lower the effective dielectric constant of the structural dielectric film. Additionally, the pitch of the first protrusions can be used to adjust the amount of air space within the dielectric film. Decreasing pitch results in adjacent protrusions being placed closer together and results in a decrease in the amount of airspace in the dielectric film. Alternatively, the geometry of the first protrusion can be one of a post (protrusion 324D in FIGS. 3D and 4D), a continuous ridge, a discontinuous ridge, a bump, a pyramid and any other three dimensional polygonal shape. The protrusions may be solid, hollow or contain an internal air pocket.

Figure 3B:
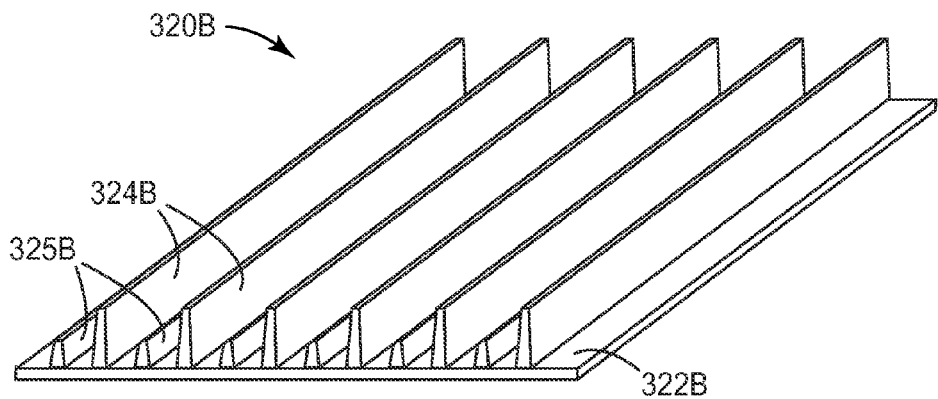
Figure 3C:
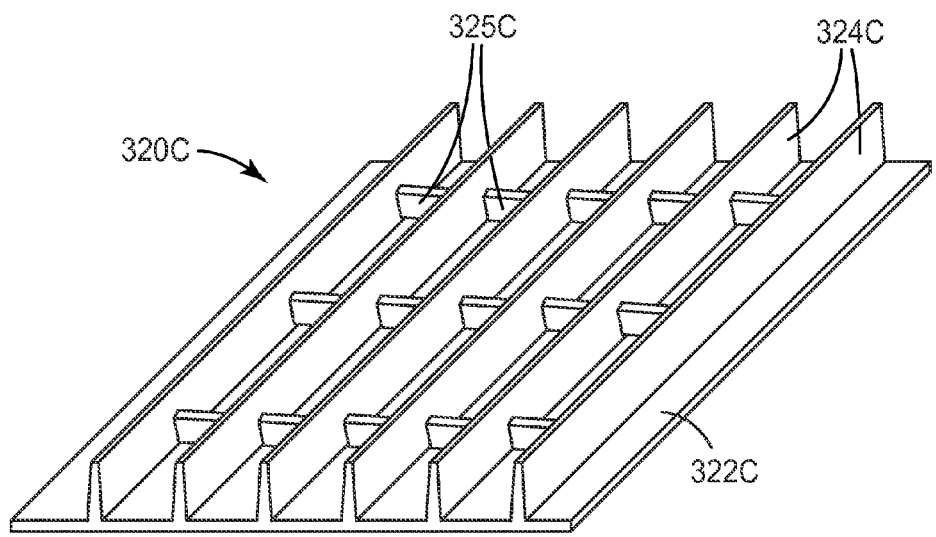
Figure 3D:
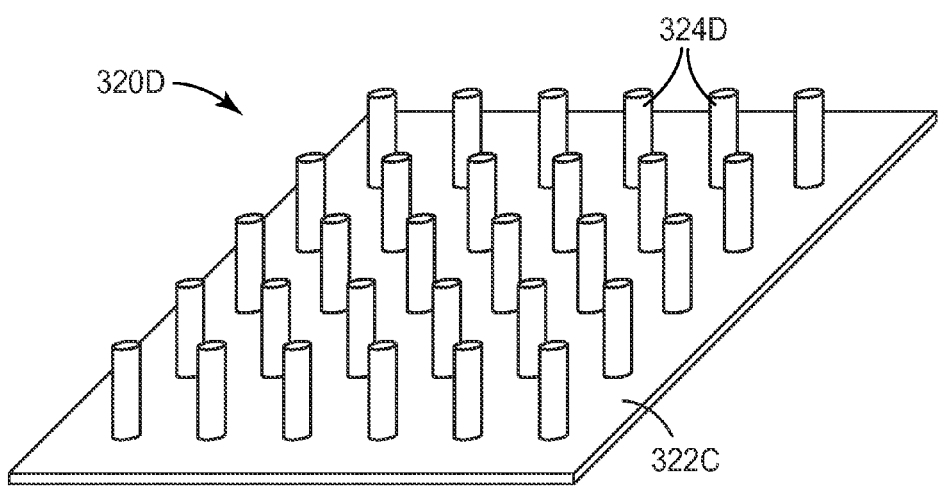
Figure 4B:
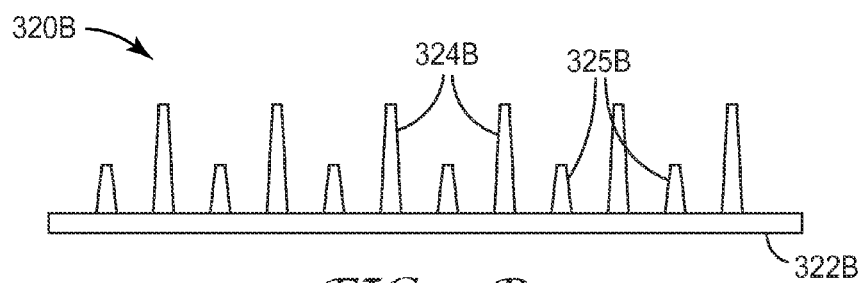

In an alternative aspect, the dielectric film can have a plurality of first protrusions and second protrusions formed on a first major surface of the base layer as shown in FIGS. 3B, 3C, 4B, and 4C. FIGS. 3B and 4B show an isometric and a cross-sectional view, respectively, of dielectric film 320B which includes a base layer 322B having a plurality of first protrusions 324B and a plurality of second protrusions 325B formed on a first major surface of the base layer. The first protrusions have a first geometry characterized by a first critical dimension and the second protrusions have a second geometry characterized by a second critical dimension. First protrusions 324B and second protrusions 325B are in the form of continuous longitudinally extending ridges. The critical dimension of the first protrusions is again the height of the ridge which controls the separation between the conductor set and the base layer of the dielectric film. The second protrusions are smaller than the first protrusions and can serve to reinforce the base layer to prevent buckling or kinking of the dielectric film allowing the first protrusions to be spaced further apart.

Figure 4C:
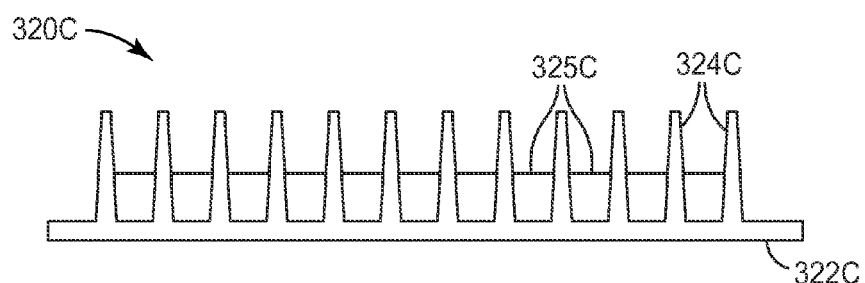
Figure 4D:
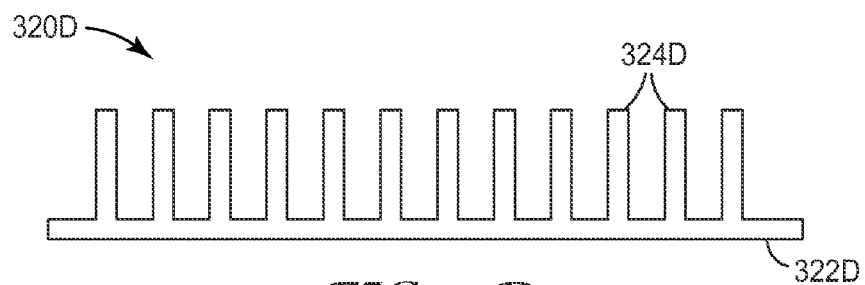

FIGS. 3C and 4C show an isometric and a cross-sectional view, respectively, of dielectric film 320C which includes a base layer 322C having a plurality of first protrusions 324C and a plurality of second protrusions 325C formed on a first major surface of the base layer. The first protrusions have a first geometry characterized by a first critical dimension and the second protrusions have a second geometry characterized by a second critical dimension. First protrusions 324B are in the form of continuous longitudinally extending ridges while the second protrusions are in the form of transverse discontinuous ridges that are disposed between the first protrusions. The critical dimension of the first protrusions is again the height of the ridge which controls the separation between the conductor set and the base layer of the dielectric film. The second protrusions are smaller than the first protrusions and can serve to reinforce the base layer to prevent buckling or kinking of the dielectric film allowing the first protrusions to be spaced further apart.

Figure 5A:
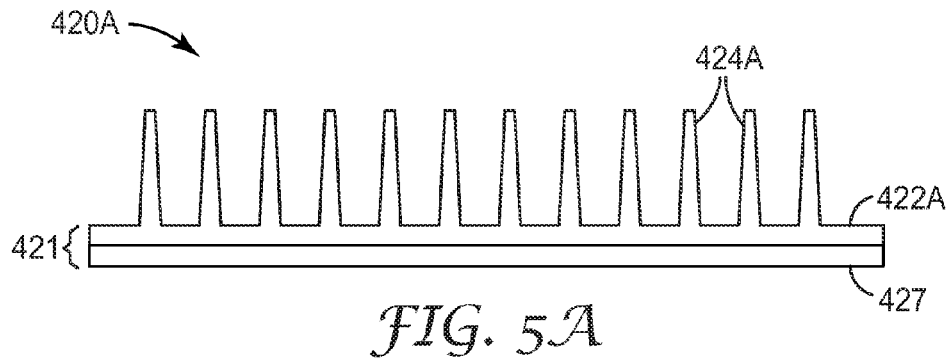
FIGS. 5A-5C show three additional cross sectional views of exemplary dielectric films that can be used in a high speed transmission cable according to an aspect the present invention.
Figure 5B:
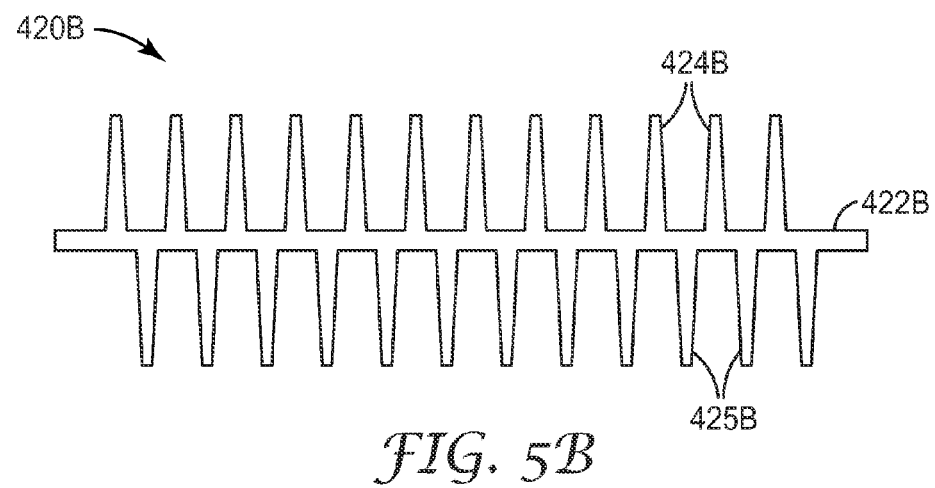
Figure 5C:
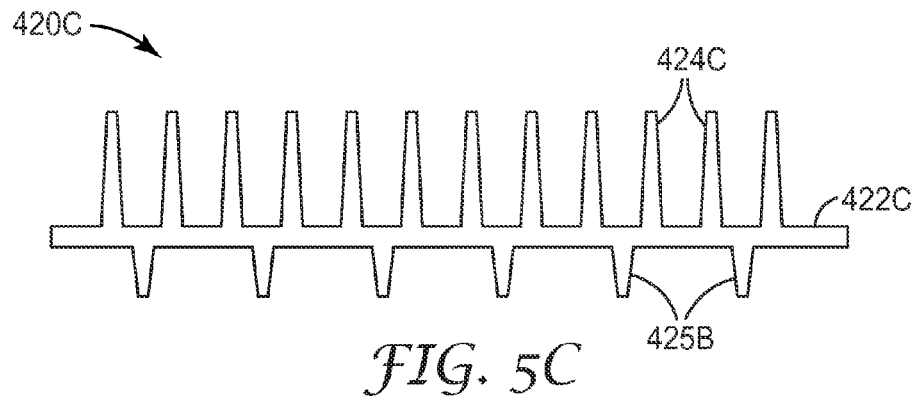

In another alternative aspect, the dielectric film can have a plurality of first protrusions formed on a first major surface of the base layer and a plurality of second protrusions formed on a second major surface of the base layer as shown in FIGS. 5B and 5C. FIG. 5B shows a cross-sectional view of dielectric film 420B which includes a base layer 422B having a plurality of first protrusions 424B formed on a first major surface of the base layer and a plurality of second protrusions 425B formed on a second major surface of the base layer. The first protrusions have a first geometry characterized by a first critical dimension and the second protrusions have a second geometry characterized by a second critical dimension. The critical dimension of the first protrusions is the height of the ridge which controls the separation between the conductor set and the base layer of the dielectric film. The critical dimension of the second protrusions is also the height of the ridge which controls the separation between the base layer and any supplemental layer (e.g. a shielding layer or protective insulating layer) or element (e.g. a drain wire or spacer) disposed adjacent to the second major surface of the dielectric film.

Base layer of the dielectric film can be one of an insulating film, a metal foil, a bilayer structure such as bilayer structure 421 (shown in FIG. 5A) which can be composed of an insulating film 422A and a metal layer 427, or another multilayer material. One exemplary multilayer material can have a buried conductor layer between two insulating layers. Another exemplary multilayer material can have a plurality of conductor layers separated by insulating layers.

The dielectric film can be formed by a variety of processes known in the art including extrusion, embossing, casting, lamination, and molding processes. The base layer and protrusions may be formed simultaneously by an extrusion process from a melt processable dielectric material, such as a thermoplastic resin, utilizing an appropriate die profile. When produced by an extrusion process, the protrusions and the base layer may be formed of a single material or the base layer may be formed of a first material and the protrusions may be formed of a second material by a co-extrusion process.

Alternatively, the protrusions of the dielectric film can be created by embossing the protrusions into the base layer. The base layer can be a film substrate of a dielectric material that softens at elevated temperatures or a partially cured dielectric material that can be cross linked after the film substrate is contacted with an embossing platen or mold on which an imprint of the protrusions has been formed. When an embossing process is used, the protrusions and the base layer will be formed of a single material.

In another alternative aspect, a melt processable dielectric material or a curable dielectric material can be dispensed on to a textured mold or roller. After cooling or curing, the material can be removed from the mold or roller yielding the structured dielectric film. In this way, the base layer and the protrusions can be formed simultaneously. In an alternative aspect, a premade film substrate may be used as the base layer. A melt processable dielectric material or a curable dielectric material can be dispensed between the base layer and a textured mold or roller. After cooling or curing, the material can be removed from the mold or roller yielding the structured dielectric film. In this way, the protrusions can be formed either of the same material as the base layer or can be a different material. For example, the protrusions can be formed by casting a curable monomer or prepolymer between the mold and an existing base layer film, followed by a UV or thermal cure.

Exemplary premade film substrates for the base layer can include polyimide films, polyester films, polyolefin films, fluoropolymer films, poly carbonate films, polyethylene naphthalate films, ethylene propylene diene monomer rubber films, liquid crystal polymer films, polyvinyl chloride films, and the like. In one exemplary aspect, premade film substrates for the base layer can be a metallized polymer film, such as a metallized polyimide or polyester film. Alternatively, base layer can be a metal foil, (e.g. a copper foil) or other planar conductive material that can be used as a substrate for forming the dielectric film. In yet another aspect, the base layer can be a material composed of two or more individual layers that have been laminated together to form a striated base layer.

When a base layer is a metal foil or includes a metallic sub-layer, the sub-layer can be used as a ground plane when the dielectric film containing the metallic sub-layer is used to form a high speed transmission cable. Integration of the ground plane into the dielectric film eliminates the need for a separate additional ground plane as well as potentially eliminating some or all of the dielectric material between the central conductor and the ground plane such as the case when the base layer is composed solely of a metallic foil or when the first major surface of the base layer on which the protrusions are formed is metallic. In either of these two aspects, the dielectric properties of the film arise from the protrusions and air that are disposed between the metallic surface of the base layer and the first conductor set.

Exemplary melt processable dielectric materials include polyolefin resins, fluoropolymer resins, polycarbonate resins, nylon resins, thermoplastic elastomer resins, ethylene vinyl acetate copolymer resins, polyester resins, and liquid crystal polymer resins.

Exemplary curable dielectric materials include thermoset resins including epoxies, silicones, and acrylates, or cross-linkable prepolymer.

FIGS. 1A-1C and FIG. 2 show exemplary high speed transmission cables that include only one conductor set. In alternative aspects of the exemplary high speed transmission cables, the cables can have a plurality of spaced apart conductor sets.

Figure 7A:
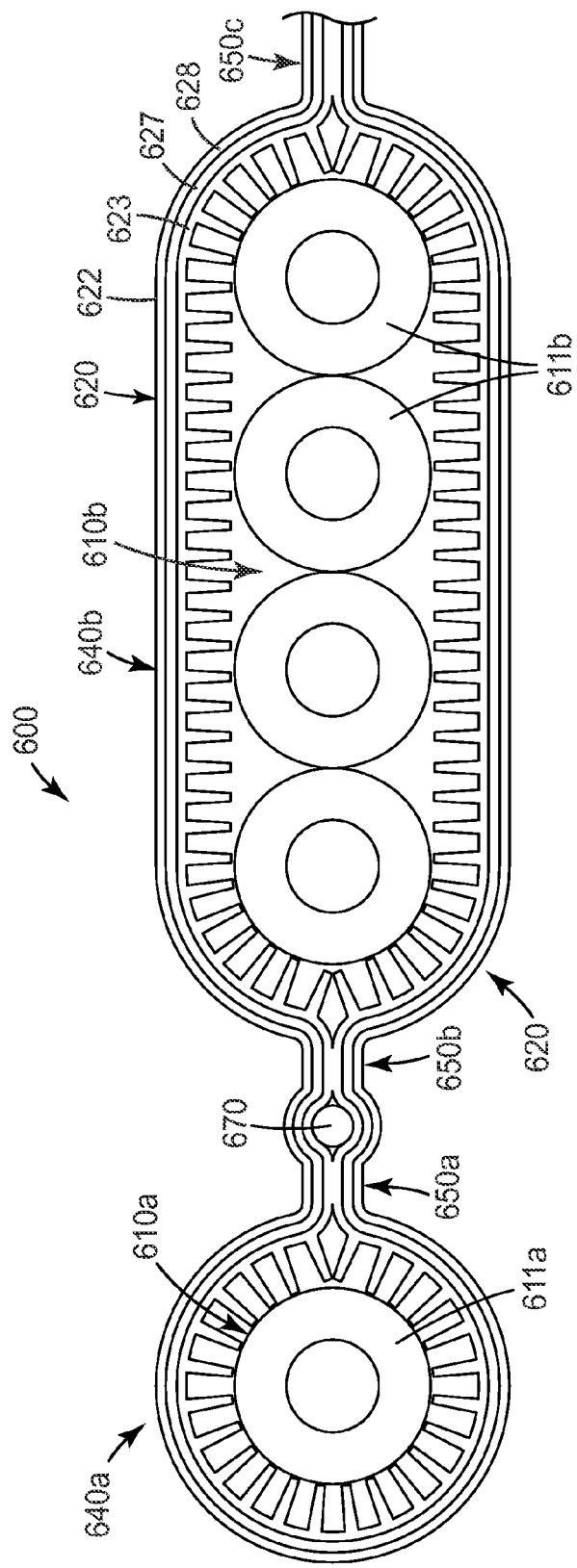
FIGS. 7A-7B show schematic cross sectional views of a portion of two exemplary alternative high speed transmission cables according to an aspect the present invention.
Figure 7B:
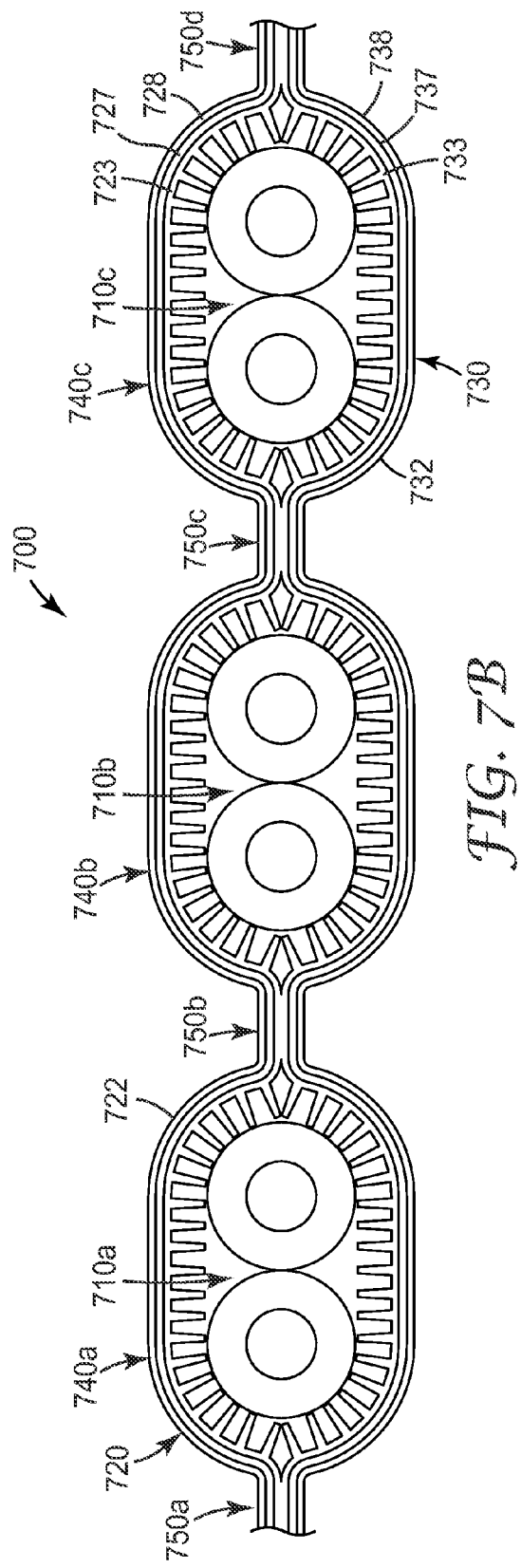

FIGS. 7A-7B show a portion of two alternative high speed transmission cable designs having a plurality of spaced apart conductor sets. These types of cable assemblies can be referred to as higher order transmission cables. Higher order transmission cables can be formed from one or more cable sub-units. A cable sub-unit can be defined as a portion of a cable that includes one or more insulating envelopes containing a conductor set.

FIG. 7A illustrates a portion of an exemplary high speed transmission cable 600 according to an aspect of the present invention that includes a first conductor set 610a, a second conductor set 610b and first dielectric film 620 at least partially concentrically disposed around the first and second conductor sets. The first and second conductor sets are spaced apart by pinched portions 650a, 650b which form insulating envelopes 640a, 640b. The first conductor set 610a includes one inner conductor 611a defining a longitudinal axis of the transmission cable and the second conductor set includes four inner conductors 611b. The first inner conductors can be bare conductors, coated conductors comprising an inner conductive core and an insulating layer surrounding the inner conductive core or coaxial cables. The second inner conductors can be coated conductors comprising an inner conductive core and an insulating layer surrounding the inner conductive core or coaxial cables to ensure that they are isolated from one another.

The first dielectric film 620 surrounds a substantial portion of the first conductor set such that the base layer of the first dielectric film is partially concentric with the first conductor set and wherein a portion of the first protrusions is disposed between the first conductor set and the base layer in the region where the base layer is concentric with the first conductor set. The first dielectric film comes together at pinch portion 650a forming a first cable sub-unit in the form of insulating envelope 640a around the first conductor set 610a. The base layer 622 of the first dielectric film 620 includes three sub-layers, an insulating sub-layer 623 having the first protrusions formed on a first major surface thereof, a metallic sub-layer 627 disposed adjacent to the second major surface of the insulating sub-layer and a protective insulating or jacket sub-layer 628 disposed over the metallic sub-layer. The metallic sub-layer can act as a shielding layer to help ground the high speed transmission cable, can help control the impedance of the cable as well as preventing electromagnetic interference emissions from the cable.

The first dielectric film 620 is then disposed on either side (i.e. the top and bottom sides as shown in FIG. 7A) of the second conductor set 610b such that the base layer of the first dielectric film is partially concentric with the second conductor set and wherein a portion of the first protrusions is disposed between the first conductor set and the base layer in the region where the base layer is concentric with the first conductor set. The first dielectric film comes together at pinch portion 650b, 650c disposed on either side of the conductor set forming a second cable sub-unit in the form of insulating envelope 640b around the second conductor set 610b. Transmission cable 600 can have additional conductor sets contained in additional cable sub-units disposed beyond pinched portion 650c.

An optional additional longitudinal member 670 can be disposed between pinched portions 650a, 650b between the first and second conductor sets. The additional longitudinal member can be a drain wire, an optical conductor, a strength member and an additional conductor set. When the additional longitudinal member is a drain wire, the drain wire can be used as a grounding element for the transmission cable.

FIG. 7B illustrates a portion of another exemplary high speed transmission cable 700 according to an aspect of the present invention that includes a first conductor set 710a, a second conductor set 710b, a third conductor set 710c, a first dielectric film 720 and a second dielectric film 730, wherein each of the first and second dielectric layers are at least partially concentrically disposed around the first, second, and third conductor sets. The first, second, and third conductor sets each include two parallel inner conductors defining the longitudinal axis of the transmission cable. The inner conductors can be coated conductors comprising an inner conductive core and an insulating layer surrounding the inner conductive core or coaxial cables to ensure that they are isolated from one another.

The first dielectric film 720 includes a base layer 722 having a plurality of first protrusions formed on a first major surface of the base layer, wherein the first dielectric film can be disposed such that the base layer is partially concentric with the conductor sets and wherein a portion of the first protrusions is disposed between the conductor sets and the base layer in the regions where the base layer is concentric with the conductor sets.

The second dielectric film 730 can be similar to first dielectric film 720 in that the second dielectric film includes a base layer 732 having a plurality of first protrusions formed on a first major surface of the base layer. The second dielectric film can be disposed partially concentric with the conductor sets opposite the first dielectric film such that the base layer of the second dielectric film is partially concentric with the conductor sets and wherein a portion of the first protrusions of the second dielectric film are disposed between the conductor sets and the base layer of the second dielectric film in the regions where the base layer is concentric with the conductor sets.

The base layers 722, 732 of the first and second dielectric films 720, 730 includes three sub-layers, an insulating sub-layer 723, 733 having the first protrusions formed on a first major surface thereof, a metallic sub-layer 727, 737 disposed adjacent to the second major surface of the insulating sub-layer and a protective insulating sub-layer 728, 738 disposed over the metallic sub-layer.

The first and second dielectric films are brought together at pinched portions 750a, 750b disposed on either side of first conductor set 710a to form insulating envelope 740a around the first conductor set; at pinched portions 750b, 750c disposed on either side of second conductor set 710b to form insulating envelope 740b around the second conductor set; and at pinched portions 750c, 750d, disposed on either side of third conductor set 710c to form insulating envelope 740c around the third conductor set. Transmission cable 700 can have additional conductor sets disposed beyond pinched portions 750a, 750d.

Figure 8A:
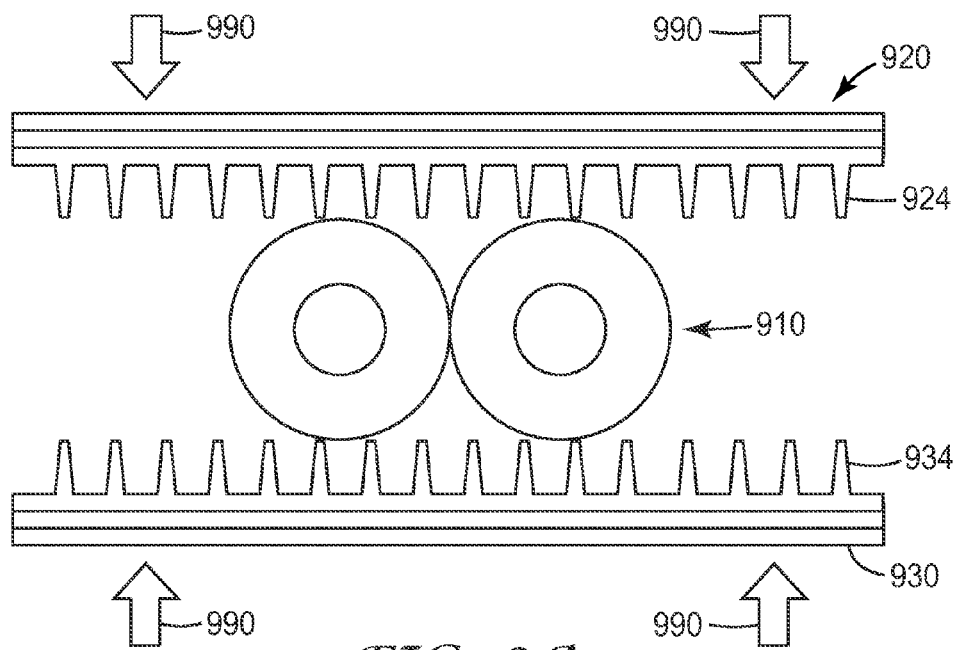
FIGS. 8A-8B show a schematic representation of one method of producing an exemplary high speed transmission cable according to an aspect the present invention.
Figure 8B:
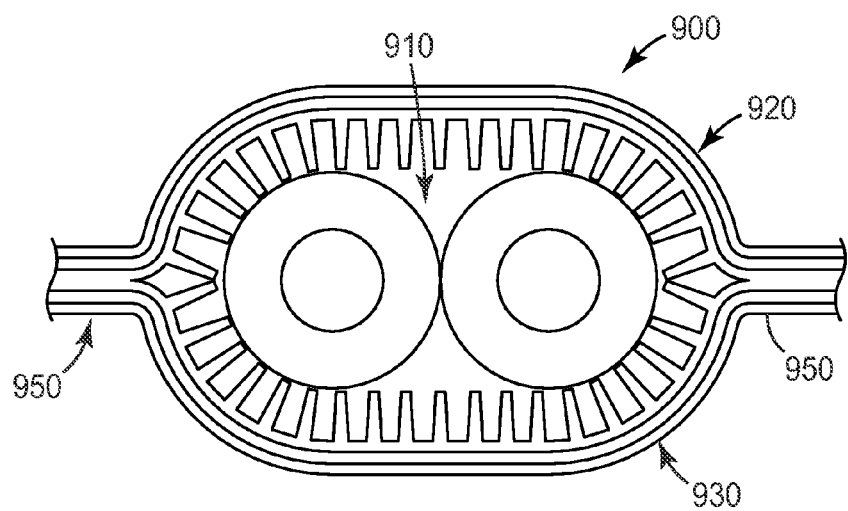

Referring to FIGS. 8A and 8B, shows a schematic representation of one method of assembling an exemplary transmission cable 900 in accordance with the current invention. FIG. 8A shows a conductor set 910 having two inner conductors, a first dielectric film 920, and a second dielectric film 930 that are brought together. Heat and pressure are applied as indicated by arrows 990 to bond the first and second dielectric films to one another in the region on either side of conductor set forming pinched portions 950 shown in FIG. 8B. The heat and pressure melt and flatten the protrusions 924, 934 of the first and second dielectric films bonding the films together.

FIGS. 6A-6D, 9A-9D and 10A-10C are a variety of schematic cross-sections of a portion of a high speed transmission cable in accordance with the current invention.

Figure 6A:
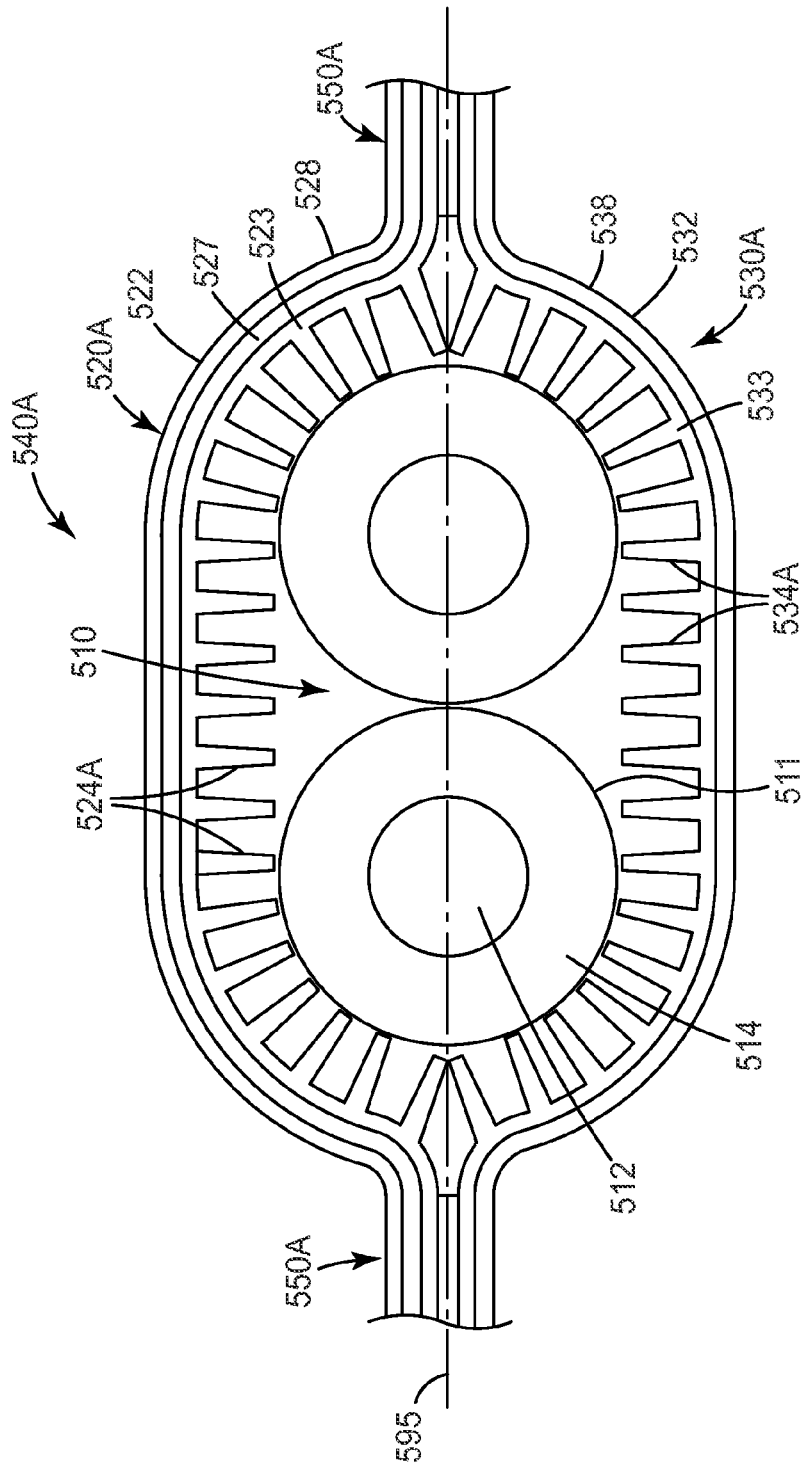
FIGS. 6A-6D show schematic cross sectional views of a portion of four exemplary alternative high speed transmission cables according to an aspect the present invention.

FIG. 6A illustrates a portion (e.g. a single insulating envelope 540A) of another exemplary high speed transmission cable that has a metallic shielding layer incorporated into only one side of the construction. The transmission cable includes a first conductor set 510, a first dielectric film 520A and a second dielectric film 530A, wherein each of the first and second dielectric films are at least partially concentrically disposed around the first conductor set. The first conductor set includes two parallel inner conductors 511 defining the longitudinal axis of the transmission cable. The inner conductors can be coated conductors comprising an inner conductive core 512 and an insulating layer 514 surrounding the inner conductive core or coaxial cables to ensure that they are isolated from one another.

The first dielectric film 520A includes a base layer 522 having three sub-layers, an insulating sub-layer 523 having a plurality of first protrusions 524A formed on a first major surface thereof, a metallic sub-layer 527 disposed adjacent to the second major surface of the insulating sub-layer and a protective insulating sub-layer 528 disposed over the metallic sub-layer. Metallic sub-layer 527 will act as a metallic shielding layer in the present construction.

The second dielectric layer 530A includes a base layer 532 having two sub-layers, an insulating sub-layer 533 having a plurality of first protrusions 534A formed on a first major surface thereof and a protective insulating sub-layer 538 adjacent to the second major surface of the insulating sub-layer.

The first and second dielectric films are brought together at pinched portions 550A, disposed on either side of first conductor set 510 to form insulating envelope 540A around the first conductor set such that the base layers of the first and second dielectric films 520A, 530A are partially concentric with the conductor sets and wherein a portion of the first protrusions 524A, 534A of the first and second dielectric film, respectively, are disposed between the conductor set and the base layer of the respective dielectric film in the regions where the base layers are concentric with the conductor set. Pinched portions 550A can be formed along the transverse mid-plane of the transmission cable 595. Alternatively, the pinched portions may be disposed along a plane either above or below the transverse mid-plane of the transmission cable.

The transmission cable can have additional conductor sets disposed on either side of insulating envelope 540A beyond pinched portions 550A. In an alternative aspect, the transmission cable can contain the single conductor set shown in FIG. 6A where pinched portions 550A form the edges of the cable.

Figure 6B:
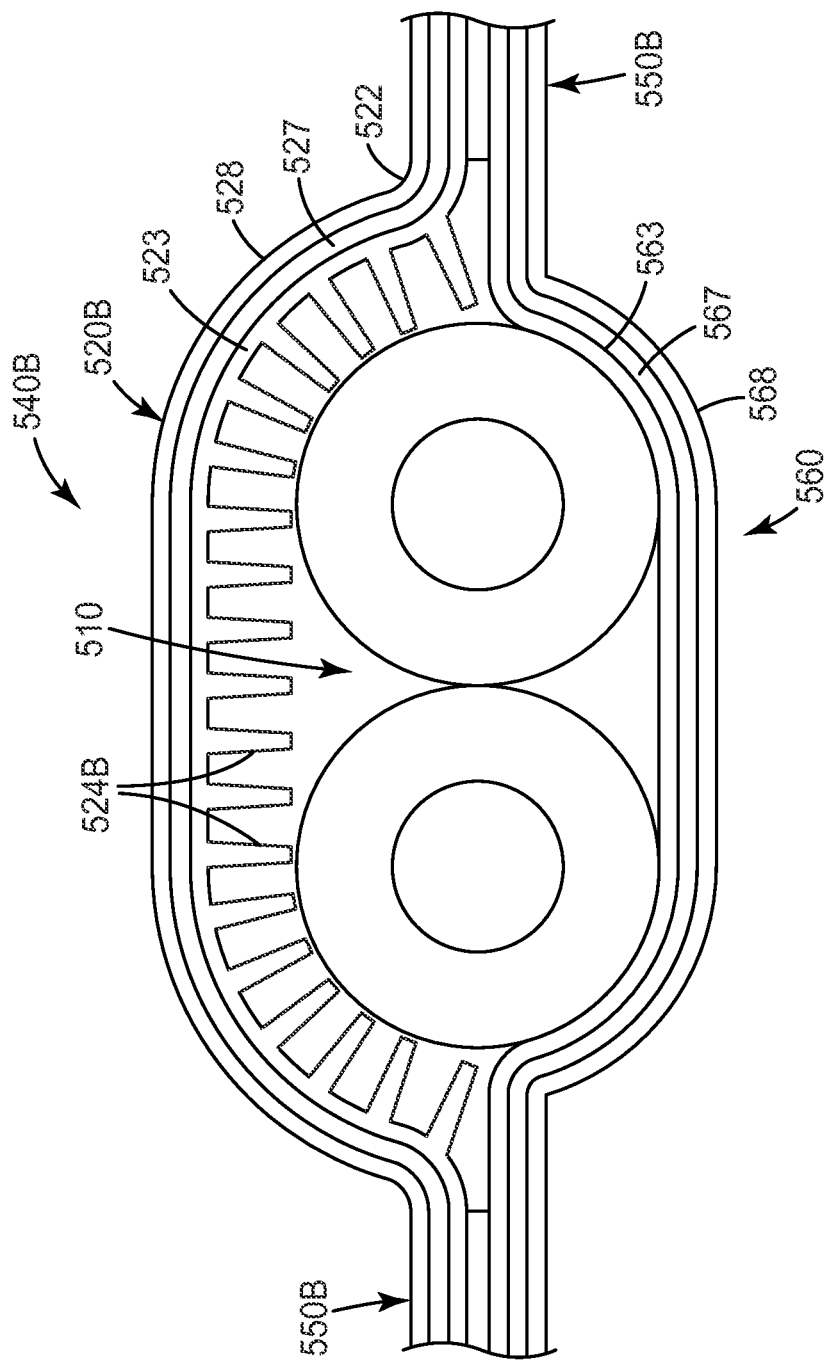

FIG. 6B illustrates a portion (e.g. a single insulating envelope 540B) of another exemplary high speed transmission cable having a structured dielectric film 520B on only one side of the first conductor set. The transmission cable includes a first conductor set 510, a first dielectric film 520B and a dielectric layer 560, wherein the first dielectric film and the dielectric layers are at least partially concentrically disposed around the first, conductor set. The first conductor set includes two parallel inner conductors defining the longitudinal axis of the transmission cable as described previously.

The first dielectric film 520B includes a base layer 522 having three sub-layers, an insulating sub-layer 523 having a plurality of first protrusions 524B formed on a first major surface thereof, a metallic sub-layer 527 disposed adjacent to the second major surface of the insulating sub-layer and a protective jacket sub-layer 528 disposed over the metallic sub-layer.

Dielectric film 560 includes three sub-layers, an insulating sub-layer 563, a metallic sub-layer 567 disposed adjacent to a major surface of the insulating sub-layer and a protective insulating sub-layer 568 disposed over the metallic sub-layer.

Metallic sub-layer 527 in the first dielectric film 520B and the metallic sub-layer 567 of dielectric film 560 will act as metallic shielding layers in the present construction.

The first dielectric film 520B and dielectric film 560 are brought together at pinched portions 550B, disposed on either side of first conductor set 510 to form insulating envelope 540B around the first conductor set such that the base layer of the first dielectric films 520B and dielectric film 560 are partially concentric with the conductor sets and wherein a portion of the first protrusions 524B of the first dielectric film are disposed between the conductor set and the base layer of the first dielectric film in the regions where the base layer is concentric with the conductor set. Pinched portions 550B can be formed along the transverse mid-plane of the transmission cable.

The transmission cable can have additional conductor sets disposed on either side of insulating envelope 540B beyond pinched portions 550B. In an alternative aspect, the transmission cable can contain the single conductor set shown in FIG. 6B where pinched portions 550B form the edges of the cable.

Figure 6C:
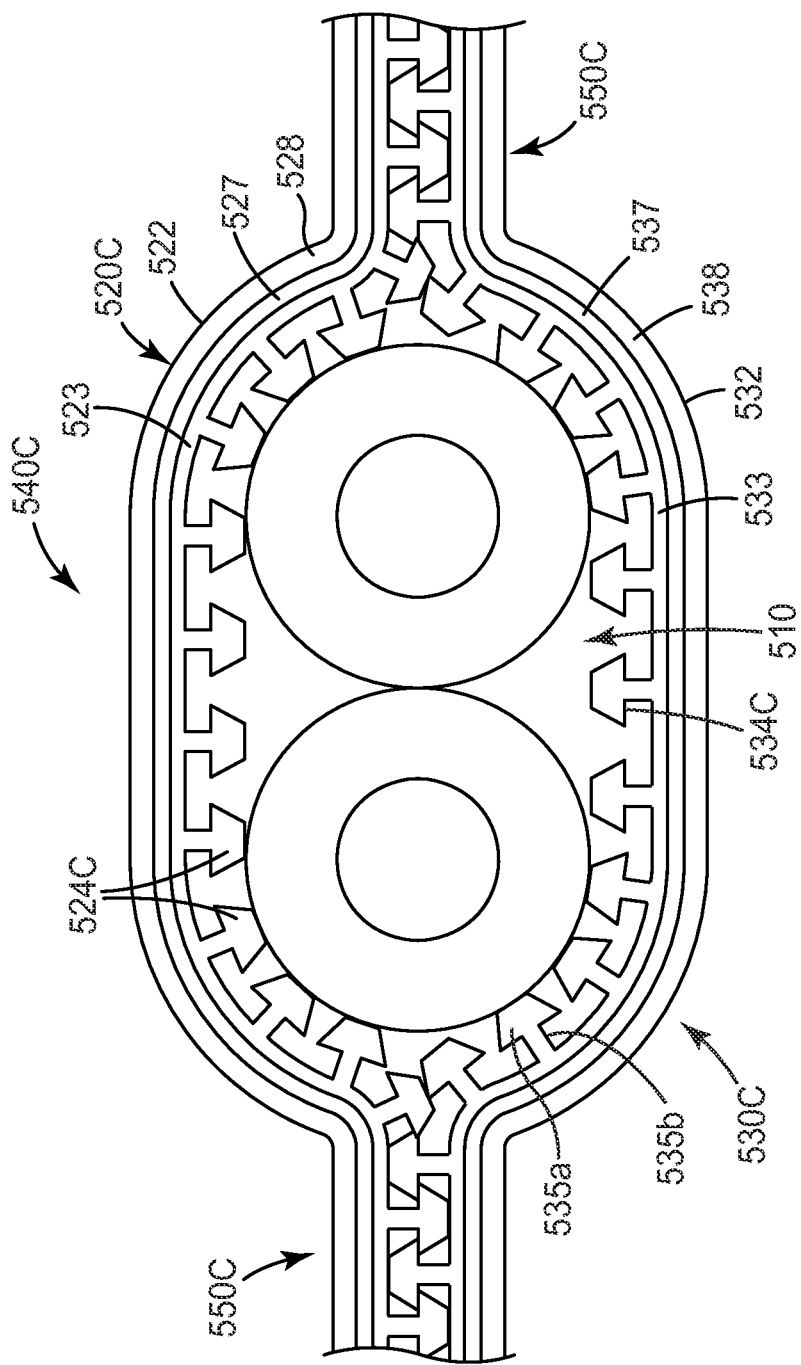

FIG. 6C illustrates a portion (e.g. a single insulating envelope 540C) of another exemplary high speed transmission cable having two structured dielectric films 520C, 530C where the protrusions 524C, 534C interpenetrate one another in pinched portions 550C on either side of first conductor set 510. The interpenetrating protrusions mechanically interlock to form insulating envelope 540C. Because the protrusions remain intact (i.e. they are not melted to form the bond between the first and second dielectric films), this construction has the advantage that the conductor set(s) are easily accessible for termination or separation in to individual conductors by simply separating the first and second dielectric films causing the protrusions to release each other.

The base layers 522, 532 of the first and second dielectric films 520C, 530C includes three sub-layers, an insulating sub-layer 523, 533 having the first protrusions 524C, 534C formed on a first major surface thereof, a metallic sub-layer 527, 537 disposed adjacent to the second major surface of the insulating sub-layer and a protective insulating or jacket sub-layer 528, 528 disposed over the metallic sub-layer. The protrusions 524C, 534C have a mushroom shape. The cap portion 535a of the mushroom shaped protrusions is larger than the stem portion 535b such that the edges of the cap portion overhang the stem portion. The edges of the cap portions of the protrusions 524C of the first structured dielectric film 520C and the edges of the cap portions of the protrusions 534C of the second structured dielectric film 530C engage with one another when an adequate pressure is applied to the first and second structured dielectric film on either side of the first conductor set 510 to form pinched portion 550C.

Figure 6D:
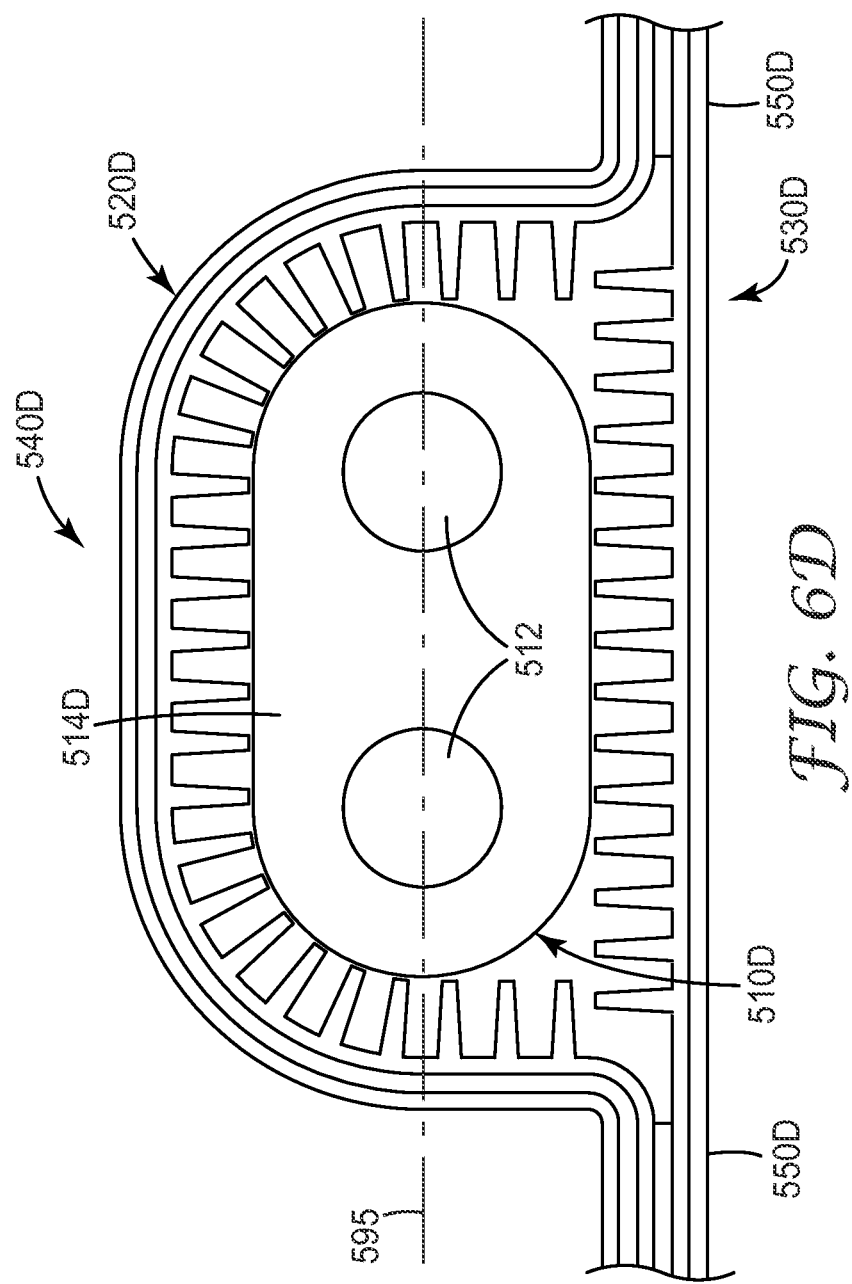

FIG. 6D illustrates a portion (e.g. a single insulating envelope 540D) of another exemplary high speed transmission cable wherein the first and second dielectric films 520D, 530D are joined together at pinched portions 550D disposed along a plane below the transverse mid-plane 595 of the transmission cable. In addition, first conductor set shown in FIG. 6D has two inner conductors 512 disposed in a single insulating layer 514D.

FIGS. 9A-9D illustrate several portions (e.g. insulating envelopes 1040A-1040D) of exemplary high speed transmission cables where the structured dielectric layers have larger second protrusions that can be disposed between the inner conductors of the conductor set enclosed within the insulating envelope. These larger second protrusions can provide some mechanical stabilization for the inner conductors.

Figure 9A:
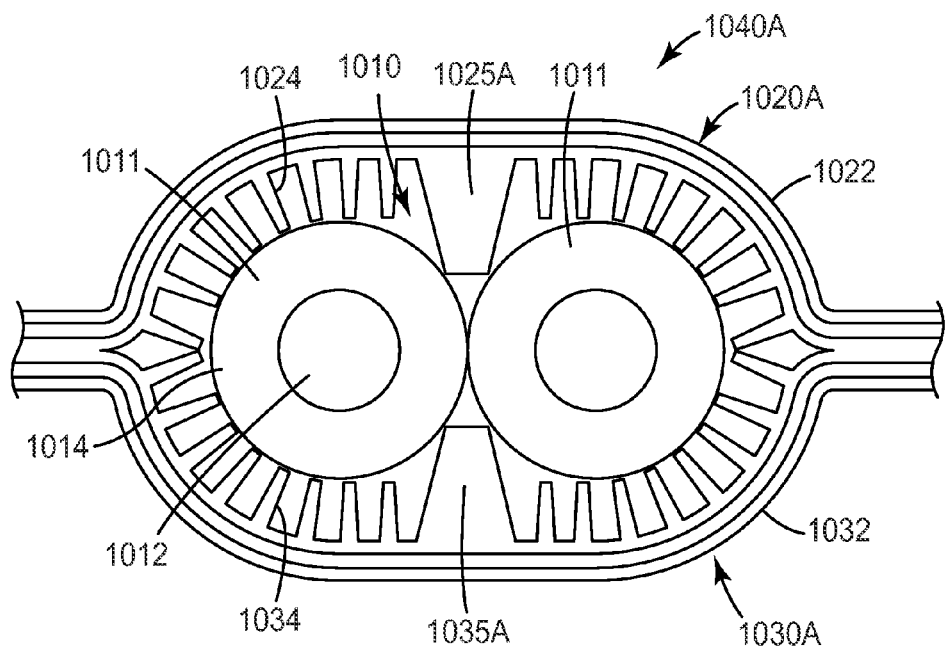
FIGS. 9A-9D show schematic cross sectional views of a portion of four exemplary alternative high speed transmission cables according to an aspect the present invention.
Figure 9B:
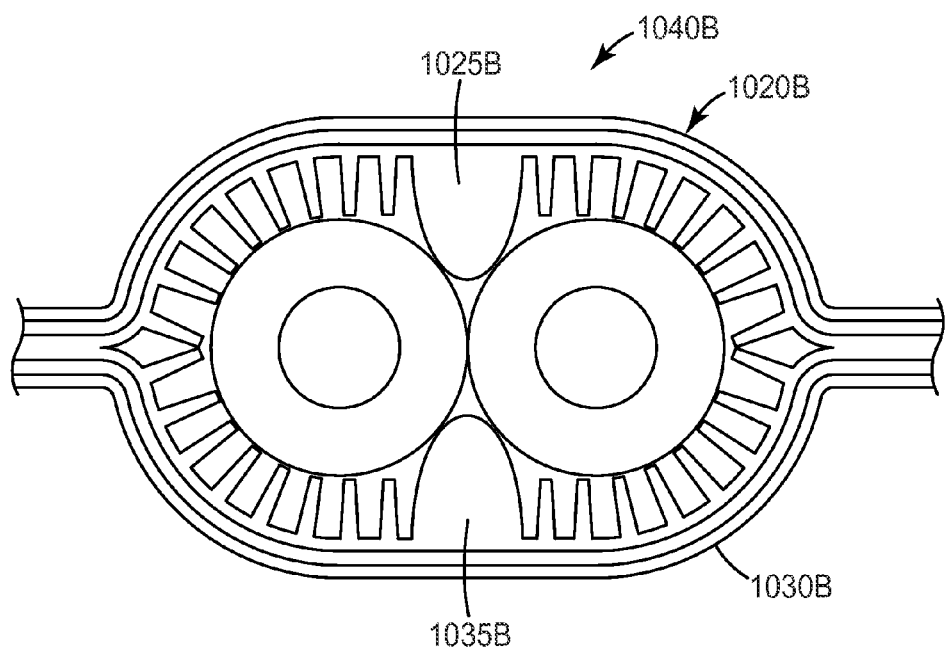

FIG. 9A illustrates a portion (e.g. a single insulating envelope 1040A) of another exemplary high speed transmission cable. The transmission cable includes a first conductor set 1010, a first dielectric film 1020A and a second dielectric film 1030A, wherein each of the first and second dielectric films are at least partially concentrically disposed around the first conductor set. The first conductor set includes two parallel inner conductors 1011 defining the longitudinal axis of the transmission cable. The inner conductors can be coated conductors comprising an inner conductive core 1012 and an insulating layer 1014 surrounding the inner conductive core or coaxial cables to ensure that they are isolated from one another.

The base layers 1022, 1032 of the first and second dielectric films 1020A, 1030A includes three sub-layers, an insulating sub-layer, a metallic sub-layer disposed adjacent to the second major surface of the insulating sub-layer and a protective insulating sub-layer disposed over the metallic sub-layer. In addition, base layers 1022, 1032 include a plurality of first protrusions 1024, 1034 and larger second protrusions 1025A, 1035A formed on the major surface of the base layers of the first and second dielectric films.

The larger second protrusions 1025A, 1035A in FIG. 9A have a trapezoidal cross section and can be in the form of a continuous ridge, a discontinuous ridge, or as individual posts. The larger second protrusions 1025B, 1035B in FIG. 9B have a semi-elliptical cross section and can be in the form of a continuous ridge, bumps or individual posts. The larger protrusions in FIGS. 9A and 9B can separate and stabilize the inner conductors. The larger protrusions may provide simple mechanical separation or can be bonded to the insulation of the inner conductors or to bare conductors if no additional insulation present.

Figure 9C:
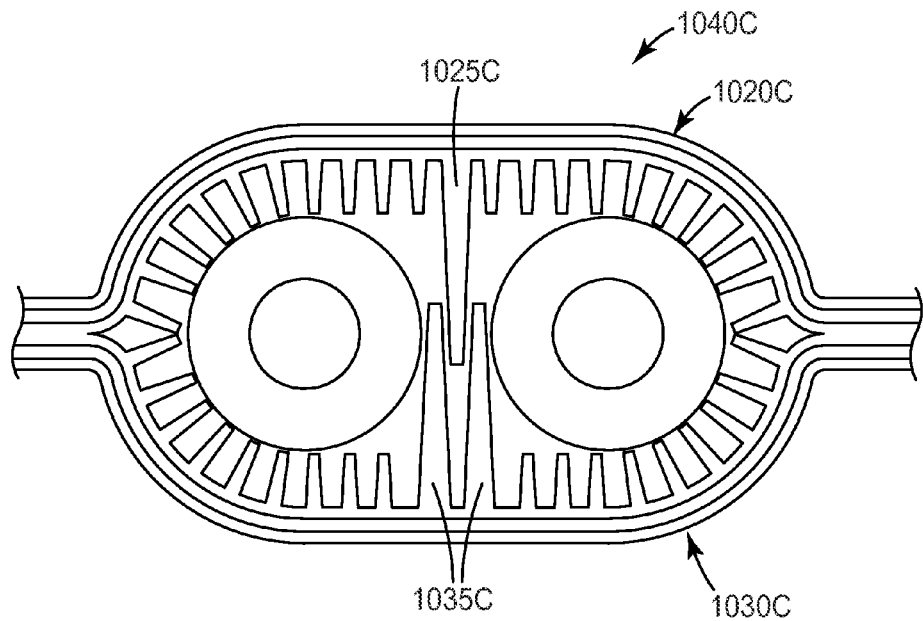
Figure 9D:
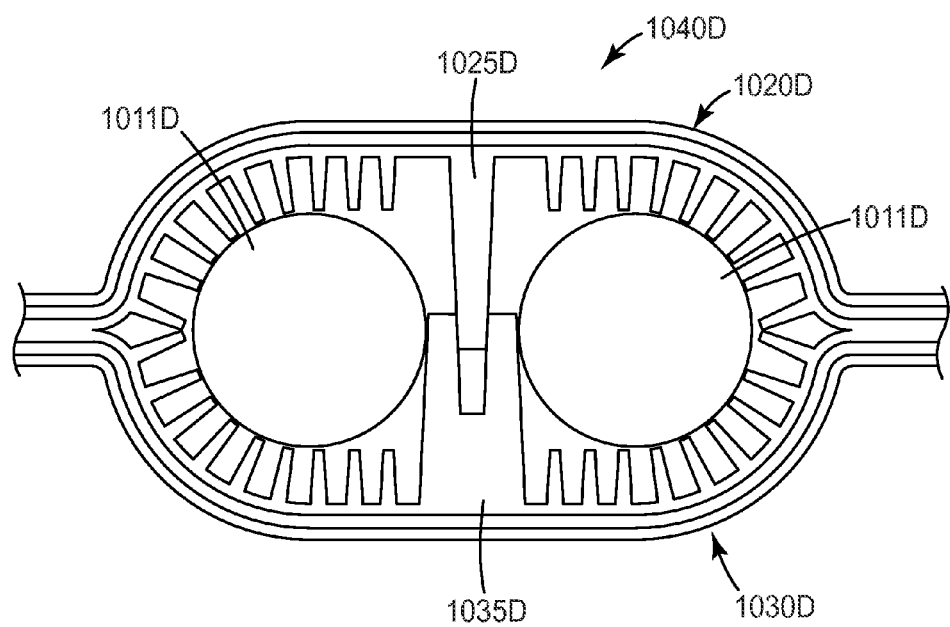

In FIGS. 9C and 9D, the larger protrusions 1025C, 1025D of the first dielectric films 1020C, 1020D, respectively, interlock with the larger protrusions 1035C, 1035D of the second dielectric films 1030C, 1030D. As shown, these protrusions can be used to bond the first and second dielectric films and to separate the inner conductors. FIG. 9D shows an exemplary portion of (e.g. a single insulating envelope 1040D) of an exemplary high speed transmission cable having a pair of bare inner conductors 1011D.

Figure 10A:
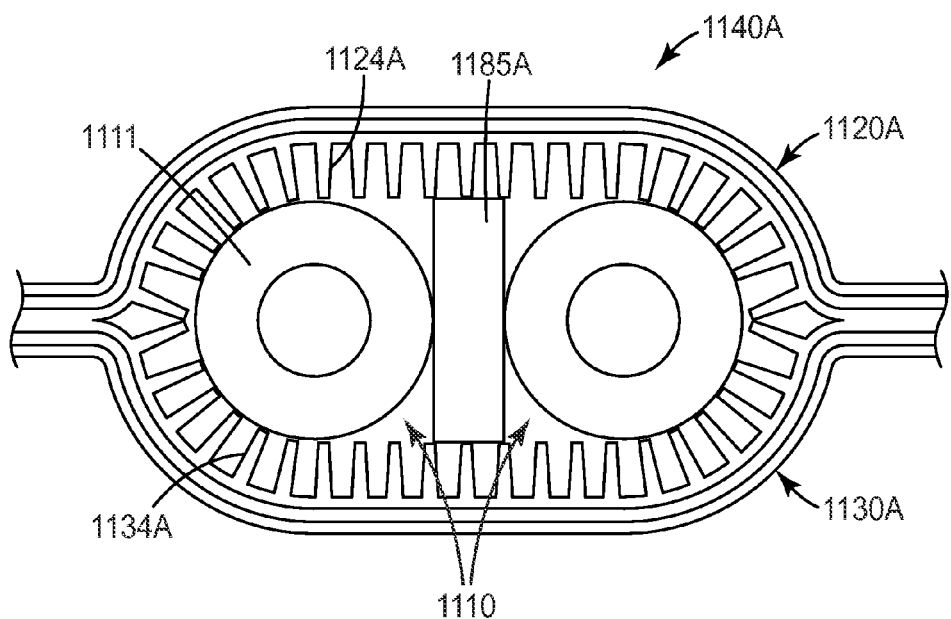
FIGS. 10A-10C show schematic cross sectional views of a portion of three exemplary alternative high speed transmission cables according to an aspect the present invention.
Figure 10B:
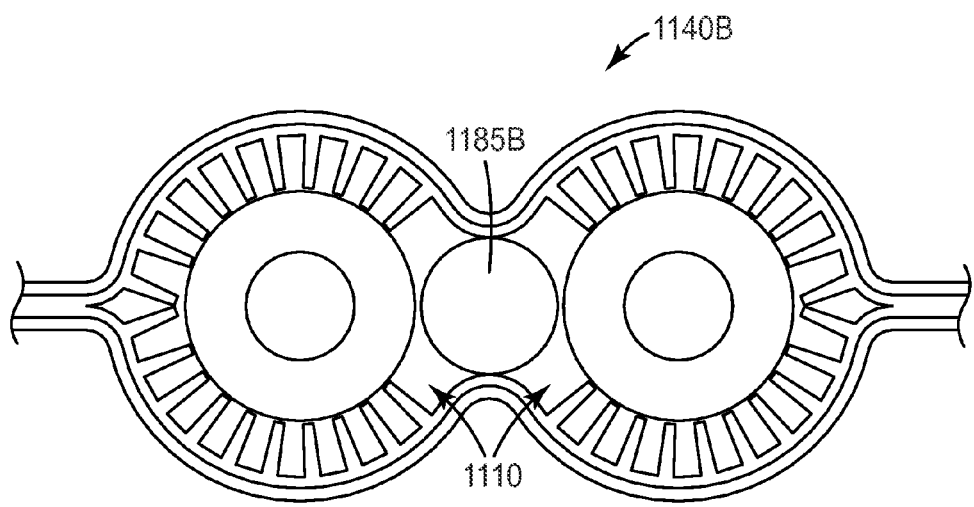
Figure 10C:
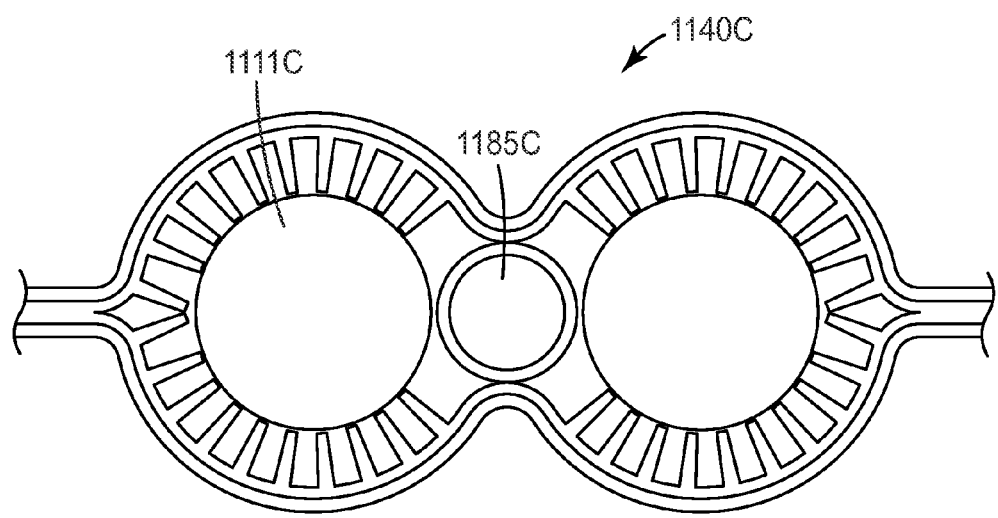

FIGS. 10A-10C illustrate several portions (e.g. insulating envelopes 1140A-1140C) of exemplary high speed transmission cables having a separator disposed between the inner conductors of the conductor set that is enclosed within the insulating envelope. These larger second protrusions can provide some mechanical stabilization for the inner conductors.

FIG. 10A illustrates a portion (e.g. a single insulating envelope 1140A) of another exemplary high speed transmission cable. The transmission cable includes a first conductor set 1110, a first dielectric film 1120A, a second dielectric film 1130A and a separator 1185A. The first and second dielectric films are at least partially concentrically disposed around the first conductor set. The first conductor set includes two parallel inner conductors 1111 defining the longitudinal axis of the transmission cable. The inner conductors can be coated conductors comprising an inner conductive core and an insulating layer surrounding the inner conductive core or coaxial cables to ensure that they are isolated from one another.

The base layers of the first and second dielectric films 1120A, 1130A includes three sub-layers, an insulating sub-layer having a plurality of first protrusions 1124A, 1134A formed on a first major surface thereof, a metallic sub-layer disposed adjacent to the second major surface of the insulating sub-layer and a protective jacket sub-layer.

Separator 1185A in FIG. 10A has a rectangular cross section. The separator can be a continuous member that runs longitudinally between the inner conductors in the first conductor set. In an alternative aspect, the separator 1185B, shown in FIG. 10B, can have an elliptical cross section between the inner conductors of conductor set 1110. While in another aspect, the separator 1185C, shown in FIG. 10C, can have an annular cross section positioned between two bare inner conductors 1111C. The separator can have a cross-section of any geometric shape compatible with the overall design of the transmission cable. While FIGS. 10A-10C show only a single separator disposed between the inner conductors of the conductor set, the transmission cable can alternatively have multiple separators disposed between each inner conductor set.

FIGS. 11A-11B, 12A-12E, and 13A-13D show several variations of a second embodiment of a high speed transmission cable in accordance with the current invention.

Figure 11A:
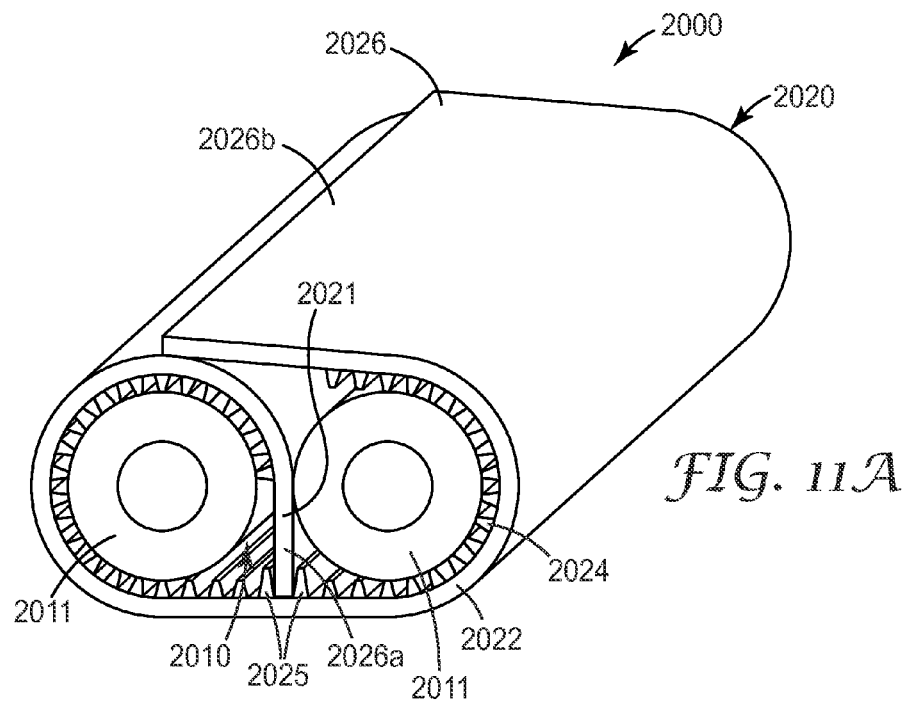
FIGS. 11A-11B show two alternative isometric views of a second embodiment of exemplary high speed transmission cable according to an aspect the present invention.

FIG. 11A shows a high speed transmission cable 2000 that includes a conductor set 2010 having two parallel inner conductors 2011 defining a longitudinal axis of the transmission cable, a structured dielectric film 2020 at least partially concentrically disposed around the conductor set wherein a section 2021 of the dielectric film is disposed between the two parallel inner conductors. The dielectric film includes a base layer 2022 having a plurality of first protrusions 2024 formed on a first major surface of the base layer. The dielectric film encloses the conductor set such that the base layer is partially concentric with the conductor set and wherein a portion of the first protrusions is disposed between the first conductor set and the base layer. Dielectric film 2020 can have one or more second protrusions 2025 formed on the first major surface of the base layer. The second protrusions can be used to secure the section of the dielectric film is disposed between the two parallel inner conductors to facilitate manufacturability of the transmission cable. Optionally, the dielectric film can have one or more flange portions 2026 that can be used to help facilitate wrapping of the dielectric film by securing the longitudinal edges of the dielectric film either between the inner conductors (e.g. flange portions 2026*a*) or by being wrapped over a portion of the second major surface of the dielectric film (e.g. flange portions 2026*b*). In an exemplary aspect, one or more of the flange portions, for example flange portion 2026*b*, of the dielectric film can be coated with an adhesive (not shown) to enable the flange portion to be bonded the second major surface of the dielectric film.

Figure 11B:
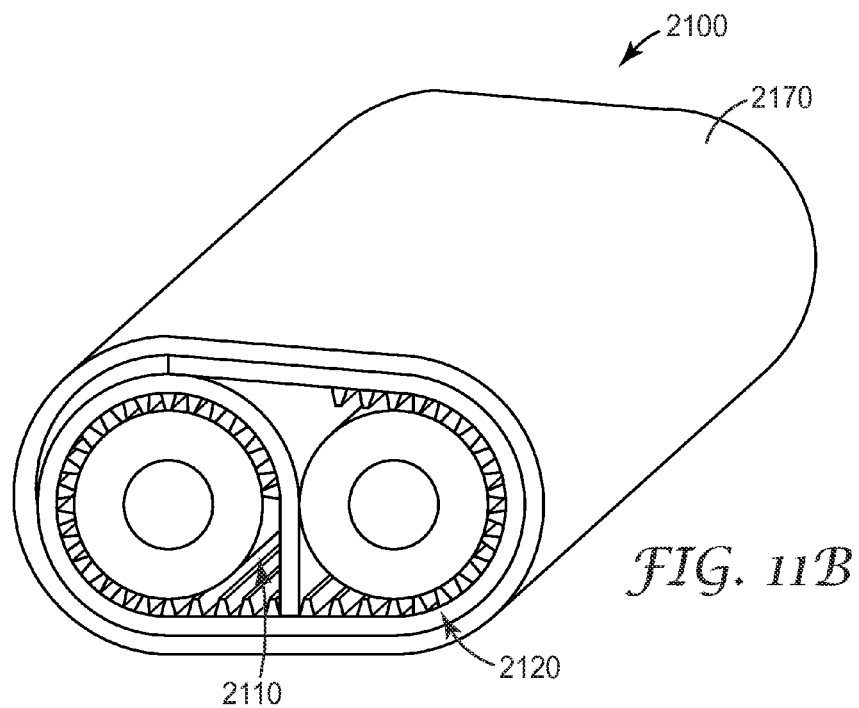

FIG. 11B shows a high speed transmission cable 2100 that is similar to transmission cable 2000 shown in FIG. 11A except that it further includes a protective insulating layer or jacket 2170 that encases conductor set 2110 wrapped in structured dielectric film 2120. In an exemplary aspect (not shown), jacket may be textured to facilitate lateral bending of the transmission cable. The texturing can take the form of thinned regions, transverse corrugations or slots in the jacket material.

High speed transmission cables 2000, 2100 can be classified as twin axial cables (also known as twinax cables) wherein two inner conductors are placed side-by-side within the cable. The structured dielectric film that surrounds the inner conductors support and interact strongly with the electric field when a current travels along the cable. As such, electrical properties of the dielectric film, such as the dielectric constant and loss, are critical to the signal speed and signal integrity of the transmission cable. These twin axial cable constructions can yield increased velocity of signal propagation, low loss, and low capacitance, which enables smaller diameter transmission cables for the same impedance as conventional cable designs. Because parallel twinax conductors is a fundamental structure for data transmission lines, there is a need to manufacture this structure in a cost-effective, efficient manner while preserving the excellent transmission line characteristics and mechanical properties of the transmission cable.

Figure 12A:
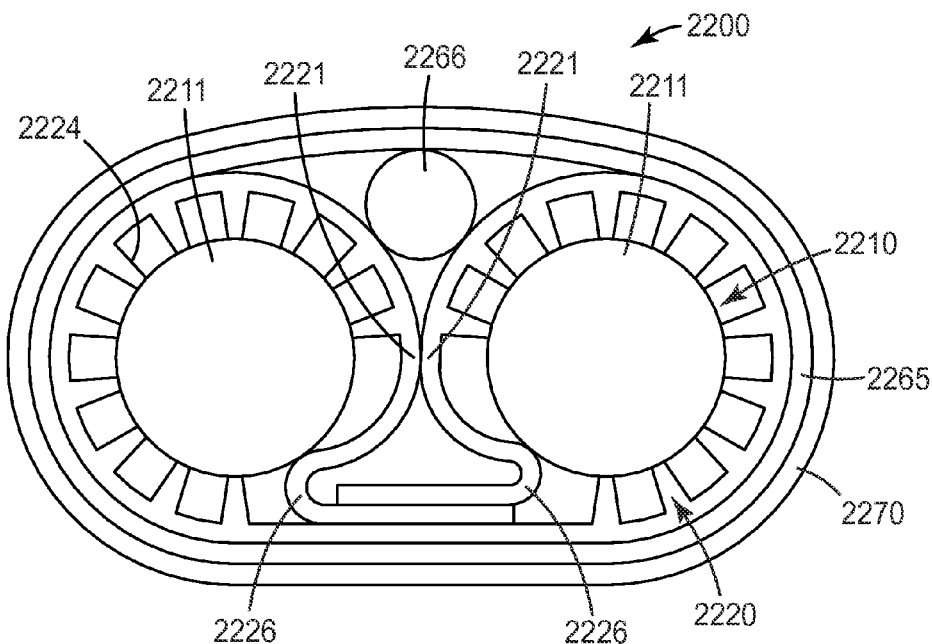
FIGS. 12A-12E show schematic cross sectional views of a portion of five exemplary alternative high speed transmission cables according to an aspect the present invention.

FIGS. 12A-12E show several variations on a twinax style high speed transmission cable in accordance with the current invention. FIG. 12A shows a cross-section of a high speed transmission cable 2200 that includes a conductor set 2210 having two parallel inner conductors 2211 defining a longitudinal axis of the transmission cable, and a structured dielectric film 2220 at least partially concentrically disposed around the conductor set. The first inner conductors in the conductor set can be bare conductors, coated conductors comprising an inner conductive core and an insulating layer surrounding the inner conductive core or coaxial cables.

Dielectric film 2220 includes a plurality of first protrusion 2224 extending from a portion of the first major surface of the dielectric film. The dielectric film includes flange portions 2226 adjacent to the longitudinal edges of the dielectric film. The flange portions are adjacent to the section 2221 of the dielectric film disposed between the two inner conductors. The flange portions of the dielectric film are free of protrusions. The flange portions 2226 are folded back on each other to secure sections 2221 between the inner conductors.

High speed transmission cable 2200 can further include an outer conductor such as shielding layer 2265 surrounding conductor set 2210 wrapped in structured dielectric film 2220. A protective jacket or insulating layer 2270 encases the shielding layer.

Optionally, high speed transmission cable 2200 can further include an additional longitudinal member. In an exemplary aspect, the additional longitudinal member can be in the form of a drain wire 2266 extending parallel to the plurality of spaced apart inner conductors 2211. Alternatively, the additional longitudinal member can be an optical conductor, a spacer, a strength member, or an additional conductor set.

Figure 12B:
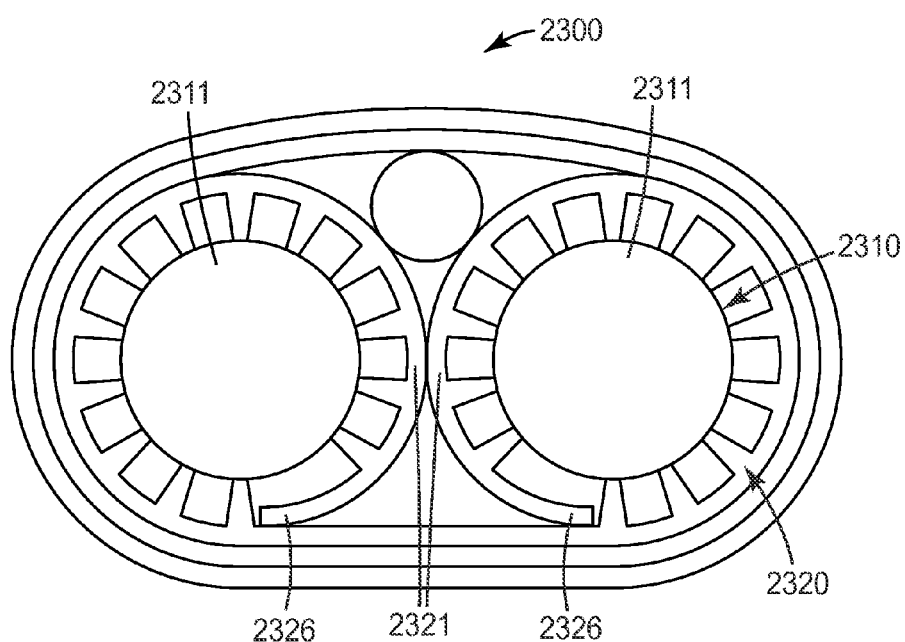

FIG. 12B is a cross-section of a high speed transmission cable 2300 that includes a conductor set 2310 having two bare parallel inner conductors 2311 defining a longitudinal axis of the transmission cable, a structured dielectric film 2320 at least partially concentrically disposed around the conductor set. The dielectric film includes flange portions 2326 adjacent to the longitudinal edges of the dielectric film and adjacent to section 2321 of the dielectric film disposed between the two inner conductors. The flange portions wrap under the inner conductors securing sections 2321 between the inner conductors.

Figure 12C:
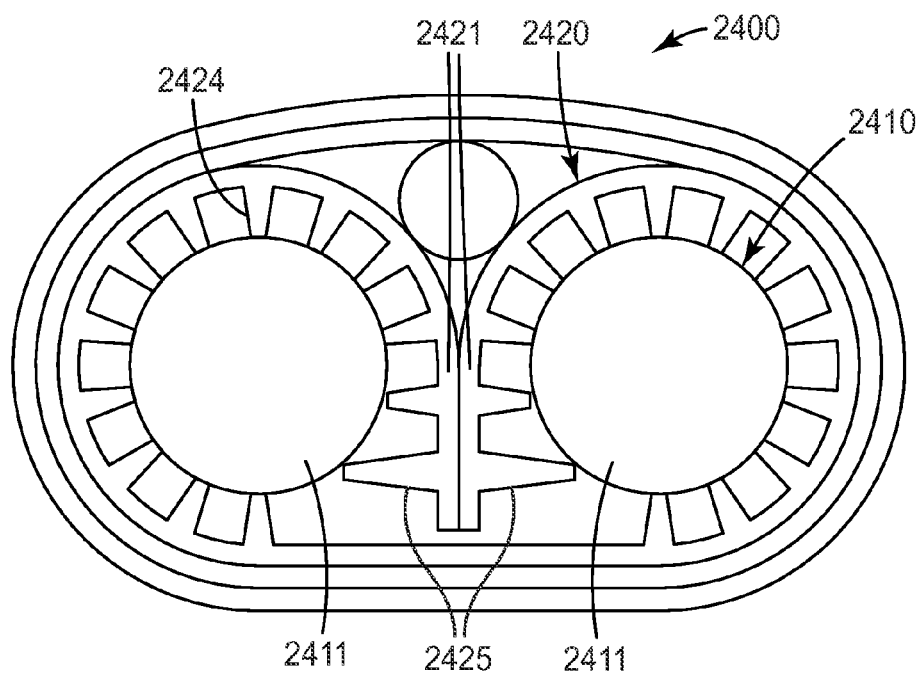

FIG. 12C is a cross-section of a high speed transmission cable 2400 that includes a conductor set 2410 having two bare parallel inner conductors 2411 defining a longitudinal axis of the transmission cable, a structured dielectric film 2420 at least partially concentrically disposed around the conductor set.

Dielectric film 2420 includes a plurality of first protrusion 2424 extending from a portion of the first major surface of the dielectric film and at least one larger protrusion 2425 disposed near each longitudinal edge of the dielectric film. The larger protrusions can help anchor sections 2421 between the inner conductors.

Figure 12D:
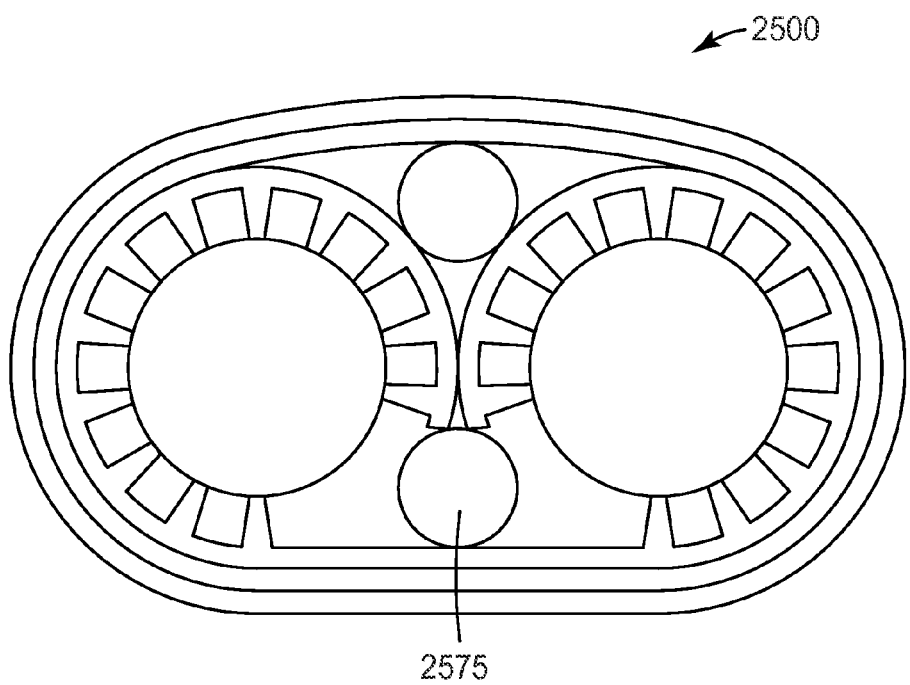

Optionally, exemplary transmission cable 2500, shown in FIG. 12D, can include at least one additional longitudinal member 2575 extending parallel to the plurality of spaced apart conductor sets. The additional longitudinal member can be a wire, monofilament or stranded material formed from a polymer such as nylon, Kevlar or other polymer resin having the desired insulating properties. Alternatively, the longitudinal member may be made of metal as would be the case if the additional longitudinal member was a drain wire. The shape of additional longitudinal member can be rectangular, elliptical or other polygonal cross-section depending on the design and application of the resulting transmission cable.

Figure 12E:
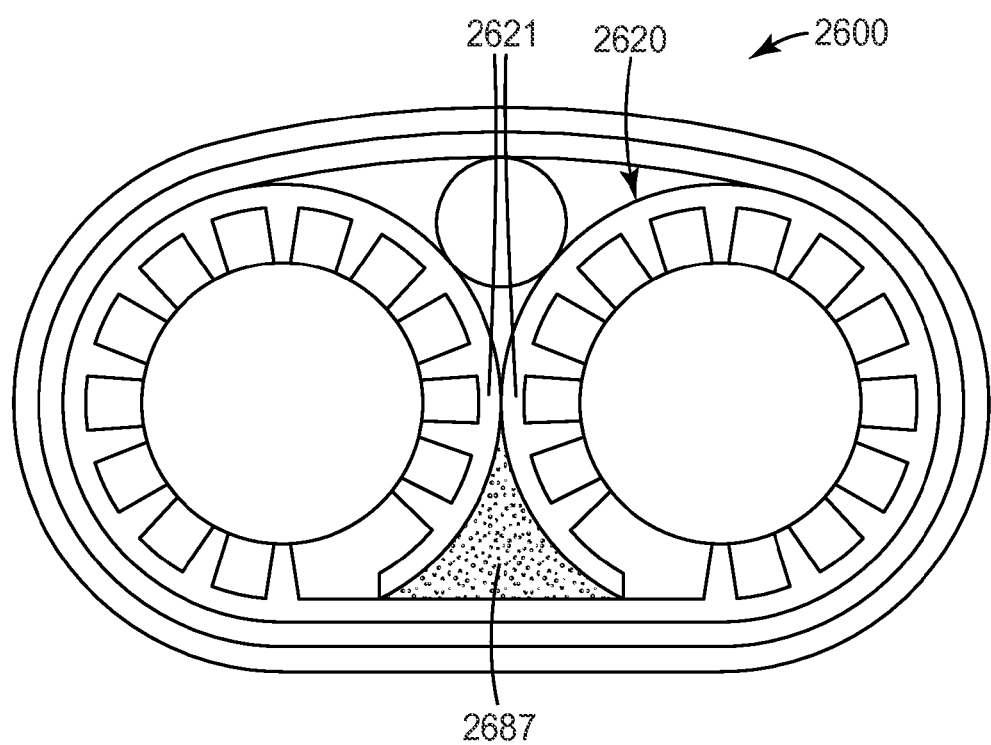

FIG. 12E shows a cross-section of a high speed transmission cable 2600 that includes a conductor set having two bare parallel inner conductors defining a longitudinal axis of the transmission cable, a structured dielectric film 2620 at least partially concentrically disposed around the conductor set. The longitudinal edges of the dielectric film are anchored by an adhesive 2687 to secure sections 2621 between the inner conductors.

Figure 13A:
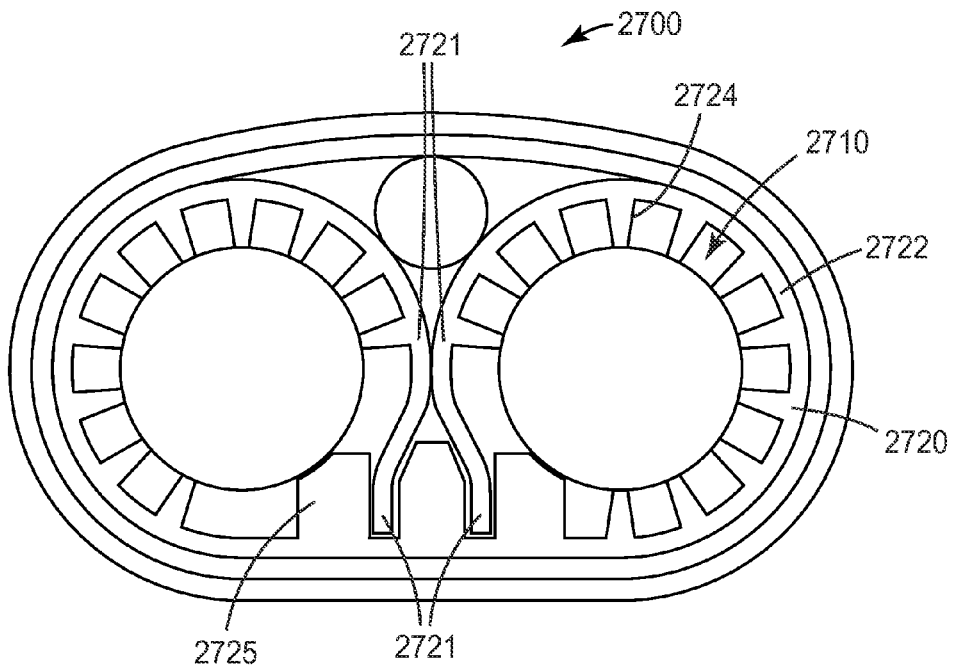
FIGS. 13A-13D show schematic cross sectional views of a portion of four additional exemplary alternative high speed transmission cables according to an aspect the present invention.

Referring to FIG. 13A, high speed transmission cable 2700 includes a conductor set 2710 having two parallel inner conductors defining a longitudinal axis of the transmission cable, a structured dielectric film 2720 at least partially concentrically disposed around the conductor set wherein a section 2721 of the dielectric film is disposed between the two parallel inner conductors. The dielectric film includes a base layer 2722 having a plurality of first protrusions 2724 formed on a first major surface of the base layer. Dielectric film 2720 can have one or more secondary protrusions 2725 formed on the first major surface of the base layer. The secondary protrusions can be used to secure section 2721 of the dielectric film.

Figure 13B:
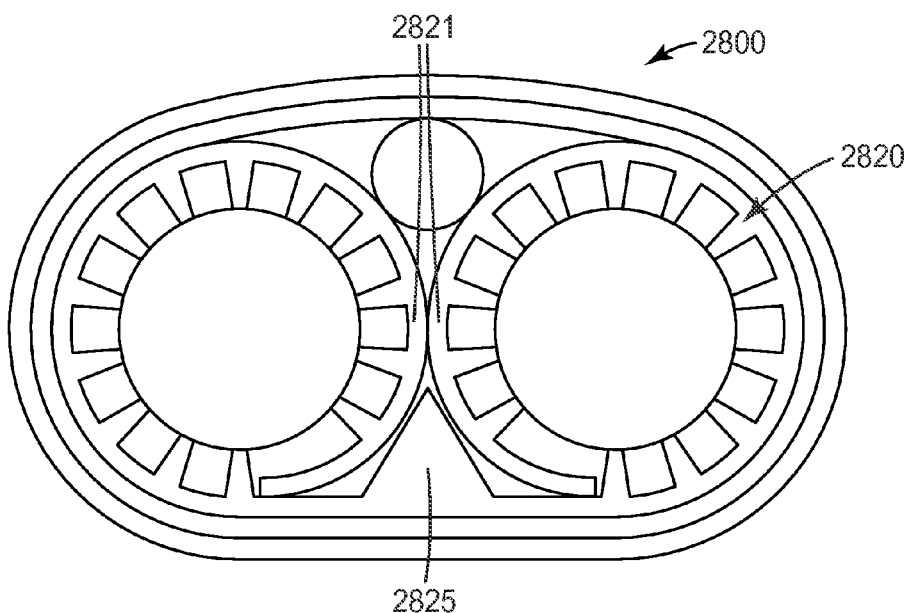
Figure 13C:
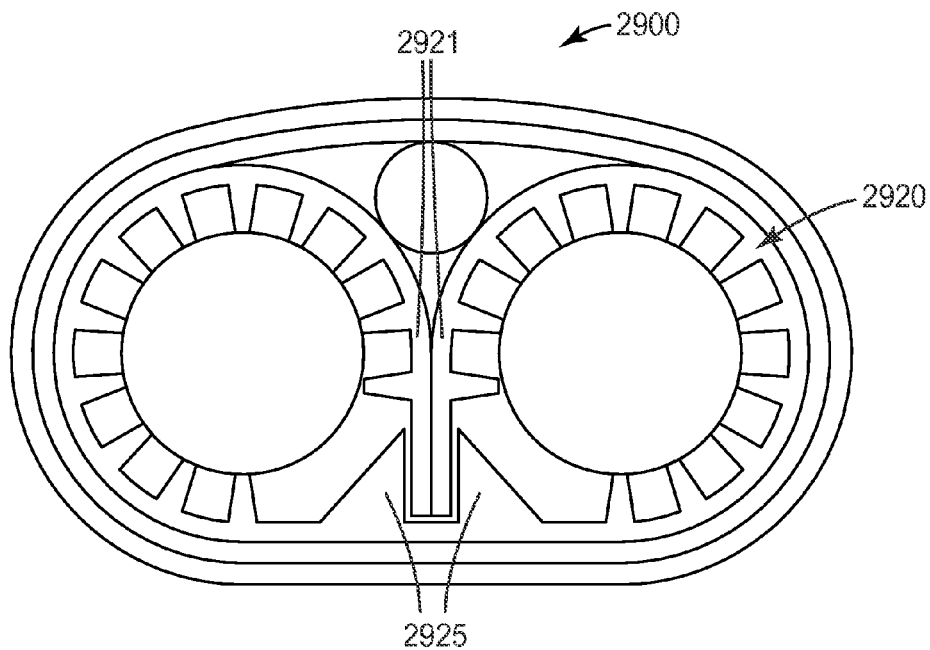

Similarly, high speed transmission cables 2800, 2900 shown in FIGS. 13B and 13C include different forms of the second protrusions 2825, 2925 to secure section 2821, 2921 of dielectric film 2820, 2920 between the pair of inner conductors.

Figure 13D:
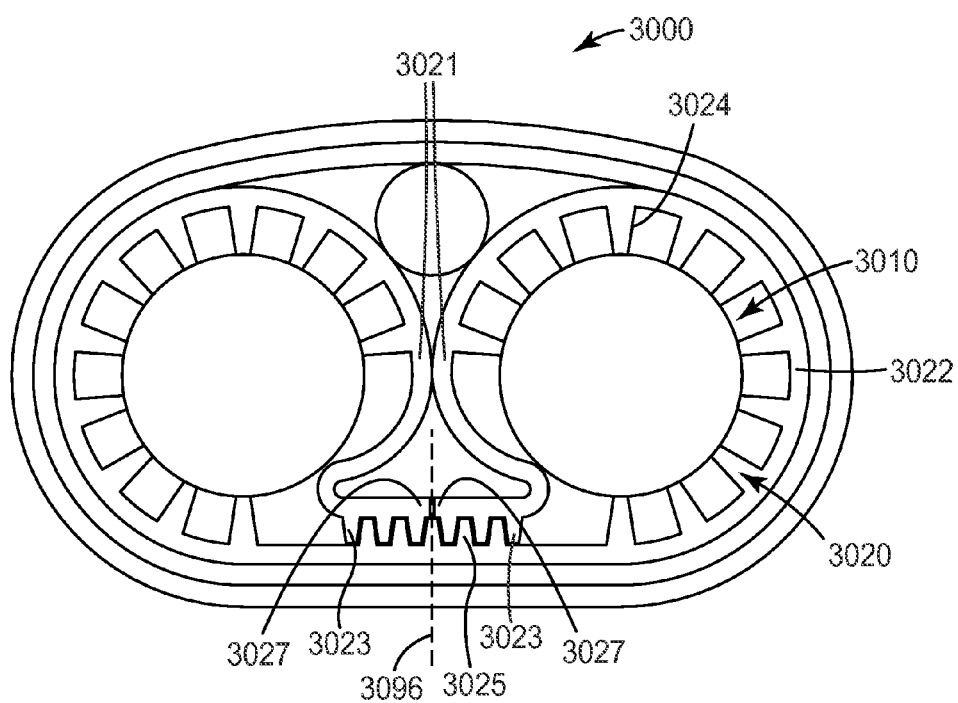

Referring to FIG. 13D, high speed transmission cable 3000 includes a conductor set 3010 having two parallel inner conductors defining a longitudinal axis of the transmission cable, a structured dielectric film 3020 at least partially concentrically disposed around the conductor set wherein a section 3021 of the dielectric film is disposed between the two parallel inner conductors. The dielectric film 3020 includes a base layer 3022 having a plurality of first protrusions 3024 formed on a first major surface of the base layer. Dielectric film 3020 can have secondary protrusions 3025 formed along the midline 3096 of the dielectric film on the first major surface of the base layer and a plurality of third protrusions disposed on the second major surface of the base layer adjacent to the longitudinal edges 3027 of the dielectric film. The second protrusions 3025 and third protrusions 3023 can be shaped to intermate with one another to secure sections 3021 between the pair of inner conductors.

In order to make the exemplary transmission cables shown in FIGS. 12A-12E and 13A-13D, the dielectric film and the inner conductors can fed into a forming tool or die 3100 as shown in FIG. 14. The forming tool has three zones: an entrance zone 3120, a wrapping zone 3140, and an exit zone 3160.

Figure 15A:
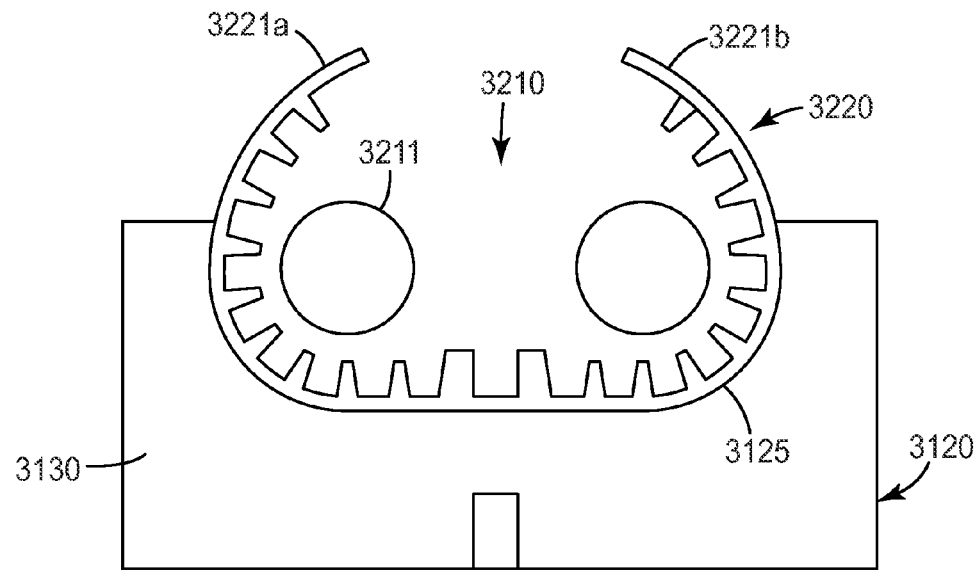
FIGS. 15A-15D are cross sectional views of an exemplary forming tool used in the fabrication process of claim 14.

The entrance zone 3120 takes the dielectric film 3220 and begins to fold the longitudinal edges 3221a, 3221b of the dielectric film up and around the inner conductors 3211 as shown in FIG. 15A, which is a cross-sectional view of the forming tool along reference line A-A in FIG. 14. The entrance zone of the forming tool includes a first body portion 3130 having a trough 3125 formed in a surface thereof. The trough varies in width and depth along the length of the entrance zone. The trough can be fairly wide and shallow at the first end 3122 of entrance zone 3120 becoming narrower and deeper at the second end 3124 of the entrance zone.

Figure 15B:
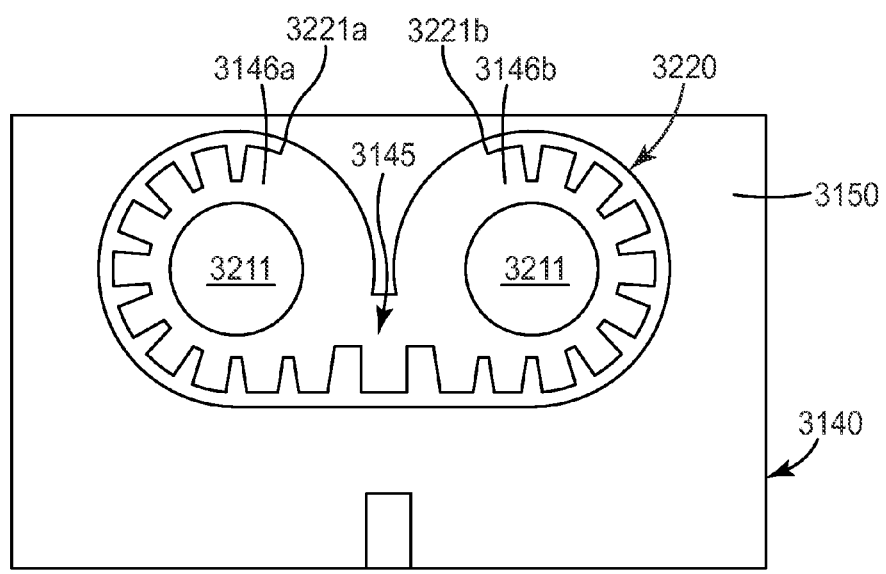
Figure 15C:
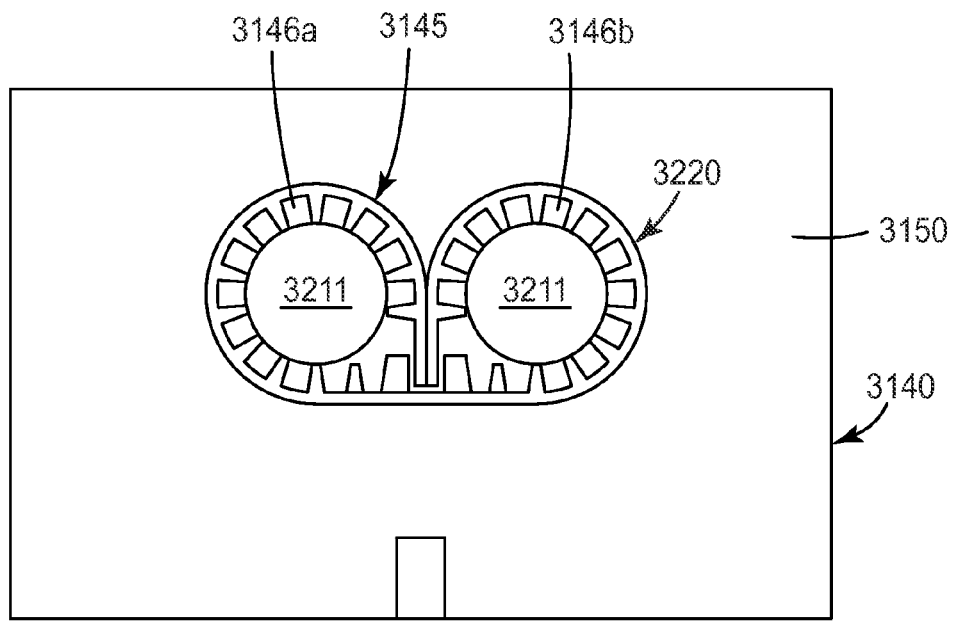
Figure 15D:
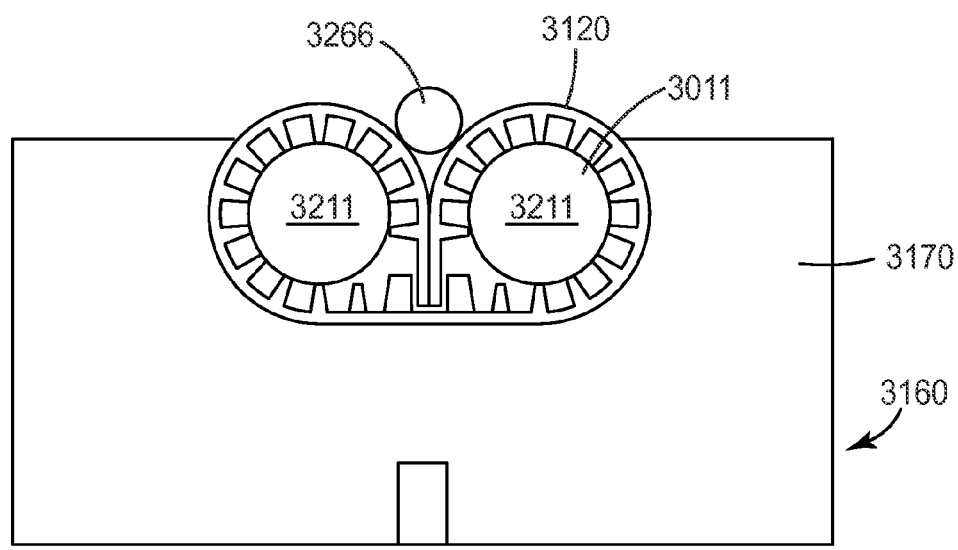

The wrapping zone 3140 can urge the longitudinal edges 3221a, 3221b of the dielectric film 3220 between the pair of inner conductors 3211 while simultaneously moving the inner conductors closer to one another as shown in FIGS. 15B and 15C. The wrapping zone includes a second body portion 3150 having a passageway 3145 extending from a first end 3142 of the wrapping portion to the second end 3144 of the wrapping portion. FIG. 15B is a cross-sectional view of the forming tool along reference line B-B in FIG. 14 at the first end of the wrapping zone. FIG. 15C is a cross-sectional view of the forming tool along reference line C-C in FIG. 14 at the second end of the wrapping zone. Passageway 3145 includes two overlapping lobe portions 3146a, 3146b. The overlapping lobe portions can be generally funnel shaped having the large end of the funnel shape at the first end of the wrapping portion and the small end of the funnel shape at the second end of the wrapping portion.

The exit zone 3160 supports the pair of inner conductors 3211 wrapped in the dielectric film 3220 while the outer conductor 3266, if applicable, is placed in the valley between the two dielectric wrapped inner conductors as shown in FIG.

15D, which is a cross-sectional view of the forming tool along reference line D-D in FIG. 14.

Additional layers (not shown) such as shielding layers, dielectric layers or an outer jacket layer can be formed around the dielectric wrapped inner conductors by conventional processes such as wrapping, braiding, taping, overcoating, extrusion, molding, etc.

Once the transmission cable is created, it can be combined with one or more other transmission cable sub-units to form a higher order structured cable for use in a cable assembly. The higher order cables or assemblies can have electrical and mechanical performance benefits over cables having a single sub-unit.

Following are exemplary embodiments of a high speed transmission cable according to aspects of the present invention.

Embodiment 1 is a high speed transmission cable comprising a first conductor set including one or more inner conductors defining a longitudinal axis of the transmission cable; a dielectric film comprising a base layer having a plurality of first protrusions formed on a first major surface of the base layer, the dielectric film having first and second longitudinal edges aligned with the first conductor set; wherein the dielectric film is disposed such that the base layer is partially concentric with the first conductor set and wherein a portion of the first protrusions is disposed between the first conductor set and the base layer in a region where the base layer is concentric with the first conductor set; and a pinched portion forming an insulating envelope around the first conductor set.

Embodiment 2 is the transmission cable of embodiment 1, further comprising a second dielectric film that includes a second base layer, the second base layer is disposed partially concentric with the first conductor set.

Embodiment 3 is the transmission cable of embodiment 2, wherein the second dielectric film further comprises a plurality of protrusions formed on a first major surface of the second base layer.

Embodiment 4 is the transmission cable of embodiment 3, wherein the plurality of protrusions formed on the second base layer of the second dielectric film are the same as the first protrusions formed on the first base layer of the first dielectric film.

Embodiment 5 is the transmission cable of embodiment 1, wherein the first base layer of the first dielectric material is selected from one of an insulating film, a metal foil, a bilayer structure composed of an insulating film and a metal layer, and other multilayer structure combinations of insulating layers and conductive layers.

Embodiment 6 is the transmission cable of embodiment 2, wherein the second base layer of the second dielectric material is selected from one of an insulating film, a metal foil, a bilayer structure composed of an insulating film and a metal layer, and other multilayer structure combinations of insulating layers and conductive layers.

Embodiment 7 is the transmission cable of any of the previous embodiments, further comprising protective insulating layer disposed adjacent to a second major surface of at least one of the first dielectric film and the second dielectric film.

Embodiment 8 is the transmission cable of embodiment 7, further comprising an outer conductor disposed between at least one of the protective insulating layer and the first dielectric film and the protective insulating layer and the second dielectric film.

Embodiment 9 is the transmission cable of embodiment 1, further comprising at least one additional longitudinal member extending parallel to the first conductor set.

Embodiment 10 is the transmission cable of embodiment 9, wherein the at least one additional longitudinal member is disposed in the insulating envelope with the first conductor set.

Embodiment 11 is the transmission cable of embodiment 9, wherein the at least one additional longitudinal member is spaced apart from the first conductor set by the pinched portion.

Embodiment 12 is the transmission cable of embodiments 9-11, wherein the at least one additional longitudinal member is one of a ground conductor, an optical conductor, a strength member and an additional conductor set.

Embodiment 13 is a transmission cable comprising: a plurality of spaced apart conductor sets arranged generally in a single plane, each conductor set including one or more substantially parallel longitudinal insulated conductors; a dielectric film comprising a base layer having a plurality of first protrusions formed on a first major surface of the base layer, the dielectric film having first and second longitudinal edges aligned with the first conductor set; wherein the dielectric film is disposed such that the base layer is partially concentric with the first conductor set and wherein a portion of the first protrusions is disposed between the first conductor set and the base layer in a region where the base layer is concentric with the first conductor set; and a pinched portion disposed between each of the plurality of spaced apart conductor sets.

Embodiment 14 is the transmission cable of embodiment 13, further comprising at least one additional longitudinal member extending parallel to the plurality of spaced apart conductor sets.

Embodiment 15 is the transmission cable of embodiment 14, wherein the at least one additional longitudinal member is disposed in the insulating envelope with at least one of the plurality of spaced apart conductor sets.

Embodiment 16 is the transmission cable of embodiment 14, wherein the at least one additional longitudinal member is spaced apart at least one of the plurality of spaced apart conductor sets by the pinched portion.

Embodiment 17 is the transmission cable of embodiments 16-18, wherein the at least one additional longitudinal member is one of a ground conductor, an optical conductor, a strength member and an additional conductor set.

Embodiment 18 is a high speed transmission cable comprising a first conductor set including two parallel inner conductors, and a dielectric film comprising a base layer having a plurality of first protrusions formed on a first major surface of the base layer, wherein the dielectric film is disposed such that the base layer is partially concentric with the conductor set such that a portion of the first protrusions is disposed between the first conductor set and the base layer in a region where the base layer is concentric with the conductor set and wherein a portion of the dielectric film is disposed between the inner conductors.

Embodiment 19 is the transmission cable of embodiment 18, wherein the dielectric film has a first longitudinal edge aligned with the first conductor set and disposed between the inner conductors of the first conductor set.

Embodiment 20 is the transmission cable of embodiment 18, further comprising a protective jacket formed on the outside of the high speed transmission cable over the wrapped dielectric film.

Embodiment 21 is the transmission cable of embodiment 18, further comprising an outer conductor disposed between the dielectric film and the protective jacket.

Embodiment 22 is the transmission cable of embodiment 21, wherein the outer conductor is a drain wire.

Embodiment 23 is the transmission cable of embodiment 18, wherein the outer conductor is a shielding layer.

Embodiment 24 is the transmission cable of embodiment 18, wherein the base layer of the dielectric film is selected from one of an insulating film, a metal foil, a bilayer structure composed of an insulating film and a metal layer, and other multilayer structure combinations of insulating layers and conductive layers.

Embodiment 25 is the transmission cable of embodiment 18, wherein the first protrusions are one of a post, a continuous ridge, a discontinuous ridge, a bump, a pyramid and any other three dimensional polygonal shape.

Embodiment 26 is the transmission cable of embodiment 18, wherein the dielectric film has a flat flange portion disposed adjacent to at least one of a first longitudinal edge and a second longitudinal edge and a textured portion that includes the first protrusions.

Embodiment 27 is the transmission cable of embodiment 26, wherein the flat flange portion is integrally formed with the dielectric film.

Embodiment 28 is the cable of embodiments 26 or 27, wherein the flat flange portion secures portion of the dielectric film is disposed between the inner conductors.

Embodiment 29 is the transmission cable of embodiment 18, further comprising a dielectric separator element disposed the inner conductors.

Embodiment 30 is the transmission cable of embodiment 18, wherein the inner conductors comprise one of an insulated metallic wire and a bare conductor.

Embodiment 31 is the transmission cable of embodiment 18, further comprising at least one additional longitudinal member extending parallel to the first conductor set.

Embodiment 32 is the transmission cable of embodiment 31, wherein the at least one additional longitudinal member is one of a ground conductor, an optical conductor, a strength member and an additional conductor set.

Embodiment 33 is the transmission cable of embodiment 10, further comprising a second protruding structure formed on the base layer of the dielectric film wherein the second protruding structure can be one of a dielectric separator and a securing device for anchoring the portion of the dielectric film is disposed between the inner conductors.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, and electrical arts will readily appreciate that the present invention may be implemented in a very vide variety of embodiments. This application is intended to cover any adoptions or variations of the preferred embodiments discussed herein. Therefore, it is manifestly intended that this invention be limited only by the claims and the equivalents thereof.

What is claimed is:

1. A high speed transmission cable comprising
a first conductor set including one or more inner conductors defining a longitudinal axis of the transmission cable;
a first dielectric film comprising a first base layer having a plurality of first protrusions formed on a first major surface of the first base layer, the first dielectric film having first and second longitudinal edges aligned with the first conductor set; wherein the first dielectric film is disposed such that the first base layer is partially concentric with the first conductor set and wherein a portion of the first protrusions is disposed between the first conductor set and the first base layer in a region where the first base layer is concentric with the first conductor set;
a second dielectric film comprising a second base layer having a plurality of second protrusions formed on a first major surface of the second base layer, the second dielectric film having first and second longitudinal edges aligned with the first conductor set; wherein the second dielectric film is disposed opposite the first dielectric film such that the second base layer is partially concentric with the first conductor set and wherein a portion of the second protrusions is disposed between the first conductor set and the second base layer in a region where the second base layer is concentric with the first conductor set; and
a pinched portion forming an insulating envelope around the first conductor set, wherein the first and second protrusions interpenetrate one another in the pinched portion.

2. The transmission cable of claim 1, wherein the plurality of protrusions formed on the second base layer of the second dielectric film are the same as the first protrusions formed on the first base layer of the first dielectric film.

3. The transmission cable of claim 1, wherein the first base layer of the first dielectric film is selected from one of an insulating film, a metal foil, a bilayer structure composed of an insulating film and a metal layer, and other multilayer structure combinations of insulating layers and conductive layers.

4. The transmission cable of claim 1, wherein the second base layer of the second dielectric film is selected from one of an insulating film, a metal foil, a bilayer structure composed of an insulating film and a metal layer, and other multilayer structure combinations of insulating layers and conductive layers.

5. The transmission cable of claim 1, further comprising a protective insulating layer disposed adjacent to a second major surface of at least one of the first dielectric film and the second dielectric film.

6. The transmission cable of claim 5, further comprising an outer conductor disposed between at least one of the protective insulating layer and the first dielectric film and the protective insulating layer and the second dielectric film.

7. The transmission cable of claim 1, further comprising at least one additional longitudinal member extending parallel to the first conductor set.

8. The transmission cable of claim 7, wherein the at least one additional longitudinal member is disposed in the insulating envelope around the first conductor set.

9. The transmission cable of claim 7, wherein the at least one additional longitudinal member is spaced apart from the first conductor set by the pinched portion.

10. The transmission cable of claim 7, wherein the at least one additional longitudinal member is one of a ground conductor, an optical conductor, a strength member and an additional conductor set.

11. A transmission cable comprising:
a plurality of spaced apart conductor sets arranged generally in a single plane, each conductor set including two or more substantially parallel longitudinal insulated conductors;
a dielectric film comprising a base layer having a plurality of first protrusions formed on a first major surface of the base layer, the dielectric film having first and second longitudinal edges aligned with the first conductor set;

wherein the dielectric film is disposed such that the base layer is partially concentric with the first conductor set and wherein a portion of the first protrusions is disposed between the first conductor set and the base layer in a region where the base layer is concentric with the first conductor set; and a pinched portion disposed between each of the plurality of spaced apart conductor sets, wherein the dielectric film comprises a plurality of second protrusions, different from the first protrusion, disposed between the insulated conductors of each conductor set.

12. The transmission cable of claim 11, further comprising at least one additional longitudinal member extending parallel to the plurality of spaced apart conductor sets.

13. The transmission cable of claim 12, wherein the at least one additional longitudinal member is disposed in the insulating envelope with at least one of the plurality of spaced apart conductor sets.

14. The transmission cable of claim 12, wherein the at least one additional longitudinal member is spaced apart at least one of the plurality of spaced apart conductor sets by the pinched portion.

15. The transmission cable of claim 12, wherein the at least one additional longitudinal member is one of a ground conductor, an optical conductor, a strength member and an additional conductor set.

16. A high speed transmission cable comprising
a first conductor set including two parallel inner conductors, and
a dielectric film comprising a base layer having a plurality of first protrusions formed on a first major surface of the base layer, wherein the dielectric film is disposed such that the base layer is partially concentric with the conductor set such that a portion of the first protrusions is disposed between the first conductor set and the base layer in a region where the base layer is concentric with the conductor set and wherein a portion of the dielectric film is disposed between the inner conductors, wherein the dielectric film has a flat flange portion disposed adjacent to at least one of a first longitudinal edge and a second longitudinal edge and a textured portion that includes the first protrusions.

17. The transmission cable of claim 16, wherein the dielectric film has a first longitudinal edge aligned with the first conductor set and disposed between the inner conductors of the first conductor set.

18. The transmission cable of claim 16, further comprising a protective jacket formed on the outside of the high speed transmission cable over the wrapped dielectric film.

19. The transmission cable of claim 16, further comprising an outer conductor disposed between the dielectric film and the protective jacket.

20. The transmission cable of claim 19, wherein the outer conductor is a drain wire.

21. The transmission cable of claim 16, wherein the outer conductor is a shielding layer.

22. The transmission cable of claim 16, wherein the base layer of the dielectric film is selected from one of an insulating film, a metal foil, a bilayer structure composed of an insulating film and a metal layer, and other multilayer structure combinations of insulating layers and conductive layers.

23. The transmission cable of claim 16, wherein the first protrusions are one of a post, a continuous ridge, a discontinuous ridge, a bump, a pyramid and any other three dimensional polygonal shape.

24. The transmission cable of claim 16, wherein the flat flange portion is integrally formed with the dielectric film.

25. The cable of claim 16, wherein the flat flange portion secures portion of the dielectric film is disposed between the inner conductors.

26. The transmission cable of claim 16, further comprising a dielectric separator element disposed the inner conductors.

27. The transmission cable of claim 16, wherein the inner conductors comprise one of an insulated metallic wire and a bare conductor.

28. The transmission cable of claim 16, further comprising at least one additional longitudinal member extending parallel to the first conductor set.

29. The transmission cable of claim 28, wherein the at least one additional longitudinal member is one of a ground conductor, an optical conductor, a strength member and an additional conductor set.

* * * * *